(12) United States Patent
Ozawa et al.

(10) Patent No.: US 8,623,765 B2
(45) Date of Patent: Jan. 7, 2014

(54) PROCESSED OBJECT PROCESSING APPARATUS, PROCESSED OBJECT PROCESSING METHOD, PRESSURE CONTROL METHOD, PROCESSED OBJECT TRANSFER METHOD, AND TRANSFER APPARATUS

(75) Inventors: Jun Ozawa, Nirasaki (JP); Gaku Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 838 days.

(21) Appl. No.: 12/542,063

(22) Filed: Aug. 17, 2009

(65) Prior Publication Data

US 2009/0301525 A1 Dec. 10, 2009

Related U.S. Application Data

(62) Division of application No. 10/801,012, filed on Mar. 16, 2004, now abandoned.

(30) Foreign Application Priority Data

Jun. 24, 2003 (JP) .................. 2003-179435
Dec. 19, 2003 (JP) .................. 2003-422821

(51) Int. Cl.
*H01L 21/306* (2006.01)
*H01L 21/67* (2006.01)

(52) U.S. Cl.
CPC ..... *H01L 21/67207* (2013.01); *H01L 21/67161* (2013.01); *H01L 21/67063* (2013.01); *H01L 21/67069* (2013.01); *H01L 21/67173* (2013.01)
USPC ............. 438/689; 438/706; 438/707; 216/58; 216/74; 156/345.1; 156/345.31; 118/719; 118/715; 414/217; 414/221; 204/298.25; 204/298.31; 204/298.35; 204/298.23

(58) Field of Classification Search
CPC ............. H01L 21/67161; H01L 21/67207; H01L 21/67063; H01L 21/67069; H01L 21/67173
USPC ............. 156/345.1, 345.31; 118/719, 715; 414/217, 221; 204/298.25, 298.31, 204/298.35, 298.23; 216/58, 74; 438/689, 438/706, 707
See application file for complete search history.

(56) References Cited

U.S. PATENT DOCUMENTS 4,184,448 A  1/1980 Aichert et al.
5,174,881 A * 12/1992 Iwasaki et al. ........... 204/298.25

(Continued)

FOREIGN PATENT DOCUMENTS

DE  27 23 284  12/1978
DE  28 12 271  10/1979

(Continued)

OTHER PUBLICATIONS

Office Action issued Mar. 1, 2011 in Taiwan Application No. 093118155 (With English Translation).

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

A processed object processing apparatus which enables a plurality of processes to be carried out efficiently. A plurality of treatment systems are communicably connected together in a line and in which the objects to be processed are processed. A load lock system is communicably connected to the treatment systems and has a transfer mechanism that transfers the objects to be processed into and out of each of the treatment systems. At least one of the treatment systems is a vacuum treatment system, and the load lock system is disposed in a position such as to form a line with the treatment systems.

12 Claims, 9 Drawing Sheets

(56) References Cited

U.S. PATENT DOCUMENTS

| | | | |
|---|---|---|---|
| 5,308,791 A | 5/1994 | Horiike et al. | |
| 5,558,482 A | 9/1996 | Hiroki et al. | |
| 5,636,960 A | 6/1997 | Hiroki et al. | |
| 5,755,888 A * | 5/1998 | Torii et al. | 118/719 |
| 5,934,856 A | 8/1999 | Asakawa et al. | |
| 6,213,704 B1 | 4/2001 | White et al. | |
| 6,305,895 B1 * | 10/2001 | Ozawa et al. | 414/217 |
| 6,335,261 B1 | 1/2002 | Natzle et al. | |
| 6,440,808 B1 | 8/2002 | Boyd et al. | |
| 6,461,437 B1 | 10/2002 | Kubota et al. | |
| 6,660,598 B2 | 12/2003 | Hanafi et al. | |
| 6,858,532 B2 | 2/2005 | Natzle et al. | |
| 2003/0219977 A1 * | 11/2003 | Pomarede et al. | 438/680 |

FOREIGN PATENT DOCUMENTS

| | | | |
|---|---|---|---|
| DE | 28 31 710 | 10/1979 | |
| DE | 39 35 002 A1 | 4/1991 | |
| DE | 44 17 026 A1 | 12/1995 | |
| EP | 0824 266 A2 | 2/1998 | |
| EP | 1 125 714 A2 | 8/2001 | |
| JP | 04162709 A * | 6/1992 | H01L 21/02 |
| JP | 7-312348 | 11/1995 | |
| JP | 8-46013 | 2/1996 | |
| JP | 10-107124 | 4/1998 | |
| JP | 2000-12649 | 1/2000 | |
| JP | 2000-129442 | 5/2000 | |
| JP | 2000-150618 | 5/2000 | |
| JP | 2000-349134 | 12/2000 | |
| JP | 2001-53131 | 2/2001 | |
| JP | 2001-135704 | 5/2001 | |
| KR | 1998-018359 | 6/1998 | |
| KR | 0167480 | 2/1999 | |
| KR | 0256215 | 6/2000 | |
| KR | 2003-0033081 | 4/2003 | |
| WO | WO 99/50472 | 10/1999 | |
| WO | WO 00/30156 | 5/2000 | |
| WO | WO 00/42650 | 7/2000 | |

* cited by examiner

FIG. 3B

| | | |
|---|---|---|
| (5) | RETURN TRANSFER MECHANISM 52 INTO LOAD LOCK CHAMBER 50, CLOSE GATE VALVES 21 AND 41, OPEN LOAD LOCK CHAMBER 50 TO ATMOSPHERIC AIR | |
| (6) | | |
| (7) | | |
| (8) | EXTEND TRANSFER MECHANISM 52 INTO COR TREATMENT CHAMBER 10, AND CARRY OUT HANDOVER OF PROCESSED OBJECT WITH PROCESSED OBJECT HOLDER 12 | |
| (9) | RETURN TRANSFER MECHANISM 52 AS FAR AS PHT TREATMENT CHAMBER 30 | |

FIG. 4A

| | | |
|---|---|---|
| (10) | | RETURN TRANSFER MECHANISM 52 INTO LOAD LOCK CHAMBER 50, AND CARRY OUT HANDOVER OF PROCESSED OBJECT WITH PROCESSED OBJECT HOLDING PART 51 |
| (11) | | EXTEND TRANSFER MECHANISM 52 INTO COR TREATMENT CHAMBER 10, AND CARRY OUT HANDOVER OF PROCESSED OBJECT WITH PROCESSED OBJECT HOLDER 12 |
| (12) | | RETURN TRANSFER MECHANISM 52 INTO LOAD LOCK CHAMBER 50, CLOSE GATE VALVES 21 AND 41 |
| (13) | | AFTER TREATMENT COMPLETED, OPEN GATE VALVE 41, EXTEND TRANSFER MECHANISM 52, AND CARRY OUT HANDOVER OF PROCESSED OBJECT WITH PROCESSED OBJECT HOLDER 32 |
| (14) | | CLOSE GATE VALVE 41 |

PROCESSED OBJECT PROCESSING APPARATUS, PROCESSED OBJECT PROCESSING METHOD, PRESSURE CONTROL METHOD, PROCESSED OBJECT TRANSFER METHOD, AND TRANSFER APPARATUS

CROSS REFERENCE TO RELATED PATENT AND APPLICATION

This application is a Divisional of U.S. Ser. No. 10/801,012 filed Mar. 16, 2004 the entire content of which is incorporated herein by reference. U.S. Ser. No. 10/801,012 claims the benefit of priority under 35 U.S.C. 119 to Japanese Application Nos. JP 2003-179435 filed Jun. 24, 2003 and JP 2003-422821 filed Dec. 19, 2003.

BACKGROUND OF THE INVENTION

1. Field of the Invention

The present invention relates to a processed object processing apparatus that processes objects to be processed, a processed object processing method, a pressure control method, a processed object transfer method, and a transfer apparatus, and in particular relates to a processed object processing apparatus that carries out CVD (chemical vapor deposition) or COR (chemical oxide removal) as an alternative to dry etching or wet etching, and more particularly, relates to a processed object processing apparatus comprising a plurality of treatment systems, a processed object transfer method for transferring the processed object therethrough, and a pressure control method for controlling a pressure therethrough.

2. Description of the Related Art

From hitherto, etching has been carried out to shape thin films using a chemical reaction. In general, the etching process forms a set with a lithography process; in the lithography process, a resist pattern is formed, and then in the etching process the thin film is shaped in accordance with the resist pattern that has been formed.

There are two types of etching, dry etching and wet etching. The most common type of dry etching is parallel plate reactive ion etching. With parallel plate reactive ion etching, a vacuum treatment chamber of a vacuum treatment apparatus (processed object processing apparatus) is put into a vacuum state, a wafer, which is an object to be processed, is put into the vacuum treatment chamber, and then an etching gas is introduced into the vacuum treatment chamber.

Inside the vacuum treatment chamber are provided a stage on which the wafer is placed, and an upper electrode which is parallel to and faces a wafer-placing surface of the stage. A high-frequency voltage is applied to the stage, whereupon the etching gas is made into a plasma. Charged particles such as positive and negative ions and electrons, neutral active species that act as etching species, and so on exist scattered around in the plasma. When an etching species is adsorbed onto a thin film on the wafer surface, a chemical reaction occurs at the wafer surface, and then products thus produced separate away from the wafer surface and are exhausted outside the vacuum treatment chamber, whereby etching proceeds. Moreover, depending on the conditions, the etching species may be sputtered onto the wafer surface, whereby etching proceeds through a physical reaction.

Here, the high-frequency electric field is applied to the wafer surface perpendicularly thereto, and hence the etching species (radicals) also move in a direction perpendicular to the wafer surface. The etching thus proceeds in the direction perpendicular to the wafer surface, rather than proceeding isotropically over the wafer surface. That is, the etching does not spread sideways across the wafer surface. Dry etching is thus suitable for microprocessing.

However, with dry etching, to carry out high-precision microprocessing conforming to a resist pattern, it is necessary to make the ratio between the etching rate for the material to be etched and the etching rate for the resist material high, and take care over etching damage caused by contamination with impurities, the occurrence of crystal defects and so on.

With wet etching, on the other hand, there is a dipping method in which the wafer is immersed in an etching bath containing a liquid chemical, and a spinning method in which a liquid chemical is sprayed onto the wafer while rotating the wafer. In either case, the etching proceeds isotropically, and hence sideways etching occurs. Consequently, wet etching cannot be used in microprocessing. Note, however, that wet etching is used even nowadays for processes such as completely removing a thin film.

Moreover, an example of a method of forming a thin film using a chemical reaction is CVD (chemical vapor deposition). With CVD, two or more reactant gases are reacted in the vapor phase or in the vicinity of the surface of a wafer or the like, and a product produced through the reaction is formed on the wafer surface as a thin film. At this time, the wafer is heated, and hence activation energy is supplied to the reactant gases by thermal radiation from the heated wafer, whereby the reaction of the reactant gases is excited.

Conventionally, in the manufacture of integrated circuits and other electronic devices for flat panel displays and so on, vacuum treatment apparatuses have been used to carry out various types of treatment such as film formation including CVD as described above, oxidation, diffusion, etching for shaping as described above, and annealing. Such a vacuum treatment apparatus is generally comprised of at least one load lock chamber, at least one transfer chamber, and at least one treatment chamber. At least two types of such vacuum treatment apparatus are known.

One type is a multi-chamber type vacuum treatment apparatus. Such a vacuum treatment apparatus is comprised of three to six process chambers as vacuum treatment chambers, a vacuum preparation chamber (load lock chamber) having a transfer mechanism for transferring semiconductor wafers, i.e. objects to be processed, into and out of each of the process chambers, a polygonal transfer chamber around which are disposed the process chambers and the load lock chamber and which has in peripheral walls thereof a plurality of connecting ports for communicating in gas-tight fashion with the process chambers and the load lock chamber via gate valves, and a transfer arm that is provided inside the transfer chamber and is able to turn, elongate and contract (see, for example, Japanese Laid-open Patent Publication (Kokai) No. H08-46013).

Moreover, the other type is a vacuum treatment apparatus having chambers in a straight line. Such a vacuum treatment apparatus has a vacuum treatment chamber in which etching is carried out on semiconductor wafers, and a load lock chamber having built therein a scalar type single pick type or scalar type twin pick type transfer arm as transfer means for carrying out handover of the wafers between the load lock chamber and the vacuum treatment chamber. That is, a vacuum treatment chamber and a load lock chamber having a transfer arm built therein are taken as one module (see, for example, Japanese Laid-open Patent Publication (Kokai) No. 2001-53131 and Japanese Laid-open Patent Publication (Kokai) No. 2000-150618).

In either of the types of vacuum treatment apparatus described above, switching between a vacuum state and an atmospheric pressure state is carried out in the load lock chamber, and smooth wafer transfer is realized between a loader that transfers the wafer set in a wafer carrier and a vacuum treatment chamber.

In the case of etching treatment, with either of the types of vacuum treatment apparatus, it has been that a high-frequency voltage is applied to an etching gas (reactive treatment gas) that has been introduced into a vacuum treatment chamber, thus making the reactive treatment gas into a plasma, whereby etching is carried out. With this dry etching, the etching treatment is carried out with excellent perpendicular anisotropy due to the etching species being controlled according to the applied voltage, and hence etching can be carried out in conformance with the required line width for lithography.

However, there have been advances in the development of microprocessing technology with regard to a photolithography process of burning circuit patterns onto wafer surfaces, and amid this a process in which exposure is carried out with ultraviolet radiation from a KrF excimer laser (wavelength 248 nm) as a photolithography light source has been put into practice, and moreover a process in which an ArF excimer laser having a yet shorter wavelength (193 nm) is used is in the process of being put into practice. Furthermore, photolithography using an $F_2$ laser (wavelength 157 nm), which enables formation of a fine pattern of line width 70 nm or less, has become the top contender for the next-generation process of 2005. However, a resist material that enables 1:1 line-and-space fine patterning with a line width of 65 nm or less at a film thickness of 150 to 200 nm without loss of dry etching resistance has not yet been developed, and with conventional resist materials a practical problem of particle contamination due to outgassing arises, and hence fine patterning by anisotropic dry etching is approaching its limit.

There are thus hopes on COR (chemical oxide removal) as a fine etching treatment method as an alternative to dry etching or wet etching. With COR, gas molecules are subjected to chemical reaction and products produced are attached to an oxide film on an object to be processed (wafer), and then the wafer is heated to remove the product, whereby a line width finer than that of a lithography pattern can be obtained. Moreover, COR involves mild isotropic etching; the etching rate is controlled through parameters such as the pressure, the gas concentrations, the gas concentration ratio, the treatment temperature, the gas flow rates, and the gas flow rate ratio, and the etching stops through the treatment amount saturating beyond a certain treatment time period. The desired etching rate can thus be obtained by controlling the saturation point.

Such COR is suitable for the manufacture of a sub-0.1 μm metal oxide semiconductor field effect transistor device comprised of a minimum-thickness poly-depletion layer, source/drain junctions having a metal silicide layer formed thereon, and very low sheet resistance poly-gates, the manufacture using a damascene-gate process comprised of source/drain diffusion activation annealing, and metal silicidation which occurs immediately before a dummy gate region that is subsequently removed and replaced with a polysilicon gate region (see, for example, the specification of U.S. Pat. No. 6,440,808).

With vacuum treatment apparatuses that carry out conventional etching treatment, there are demands for it to be possible to carry out a plurality of processes more efficiently. Moreover, for vacuum treatment apparatuses that carry out COR treatment or CVD treatment, treatment to cool wafers that have been heated through the COR treatment or CVD treatment is required, and hence there are again demands for it to be possible to carry out a plurality of processes more efficiently. However, with conventional vacuum treatment apparatuses, as described above, switching between a vacuum state and an atmospheric pressure state is carried out in a load lock chamber, and yet the load lock chamber contains both a transfer arm and a cooling mechanism for cooling wafers, and hence the volume of the load lock chamber inevitably becomes large, and thus the switching between the vacuum state and the atmospheric pressure state requires much time. Moreover, a wafer that has been transferred into the load lock chamber is exposed to air convection due to the switching between the vacuum state and the atmospheric pressure state for a long time, and hence there is a risk of attachment of particles caused to fly up by the convection.

SUMMARY OF THE INVENTION

It is an object of the present invention to provide a processed object processing apparatus that processes objects to be processed, a processed object processing method, a pressure control method, a processed object transfer method, and a transfer apparatus, which enable a plurality of processes to be carried out efficiently.

To attain the above object, in a first aspect of the present invention, there is provided a processed object processing apparatus that processes objects to be processed, comprising a plurality of treatment systems that are communicably connected together in a line and in which the objects to be processed are processed, and a load lock system that is communicably connected to the treatment systems, the load lock system having a transfer mechanism that transfers the objects to be processed into and out of each of the treatment systems, and at least one of the treatment systems is a vacuum treatment system, and the load lock system is disposed in a position such as to form a line with the treatment systems.

To attain the above object, in a second aspect of the present invention, there is provided a processed object processing apparatus that processes objects to be processed, comprising a COR treatment system in which the objects to be processed are subjected to COR treatment, at least one vacuum treatment system in which the objects to be processed are subjected to other treatment, the COR treatment system and the at least one vacuum treatment system being communicably connected together in a line, and a load lock system that is communicably connected to the COR treatment system and the at least one vacuum treatment system, the load lock system having a transfer mechanism that transfers the objects to be processed into and out of each of the COR treatment system and the at least one vacuum treatment system.

Preferably, the at least one vacuum treatment system is a heat treatment system that is connected to the COR treatment system, heat treatment is carried out on objects to be processed that have been subjected to the COR treatment.

More preferably, the COR treatment system and the heat treatment system are always in a vacuum state.

Still more preferably, the load lock system is disposed in a position such as to form a line with the at least one vacuum treatment system.

To attain the above object, in a third aspect of the present invention, there is provided a processed object processing method for a processed object processing apparatus including at least a load lock system, a COR treatment system in which objects to be processed are subjected to COR treatment, a heat treatment system in which heat treatment is carried on the objects to be processed that have been subjected to the COR treatment, and a loader module communicably connected to the load lock system, the method comprising a first load lock system transfer-in step of transferring a first object to be processed into the load lock system, a first evacuating step of evacuating the load lock system after execution of the first load lock system transfer-in step, a first COR treatment system transfer-in step of transferring the first object to be processed into the COR treatment system after the evacuation in the first evacuating step has been completed, a COR treatment commencement step of commencing COR treatment on the first object to be processed, a second lock system transfer-in step of transferring a second object to be processed into the load lock system during the COR treatment on the first object to be processed, a second evacuating step of evacuating the load lock system after execution of the second load lock system transfer-in step, a first transfer step of transferring the first object to be processed from the COR treatment system into the heat treatment system after the evacuation in the second evacuating step has been completed and after the COR treatment on the first object to be processed has been completed, a second transfer step of transferring the object to be processed from the load lock system into the COR treatment system, a simultaneous treatment commencement step of commencing COR treatment on the second object to be processed in the COR treatment system, and commencing heat treatment on the first object to be processed in the heat treatment system, a third transfer step of transferring the first object to be processed from the heat treatment system into the load lock system after the heat treatment on the first object to be processed has been completed, and a replacing step of communicating the load lock system and the loader module with one another to replace the first object to be processed in the load lock system with a third object to be processed waiting in the loader module.

To attain the above object, in a fourth aspect of the present invention, there is provided a pressure control method for a processed object processing apparatus comprising at least a load lock system, a COR treatment system in which objects to be processed are subjected to COR treatment, a heat treatment system in which heat treatment is carried out on objects to be processed that have been subjected to the COR treatment, and a loader module from and into which the objects to be processed are transferred into and from the load lock system, the method comprising a transfer-in step of placing the load lock system into an atmospheric pressure state and transferring an object to be processed that has not been subjected to COR treatment from the loader module into the load lock system, while evacuating the heat treatment system, a load lock system evacuating step of terminating the evacuation of the heat treatment system, and evacuating the load lock system down to a set pressure, a heat treatment system evacuating step of terminating the evacuation of the load lock system after the load lock system has reached the set pressure, and evacuating the heat treatment system so as to satisfy a condition that pressure inside the heat treatment system is less than pressure inside the load lock system, and a first communicating step of communicating the load lock system with the heat treatment system while continuing to exhaust the heat treatment system after the condition that the pressure inside the heat treatment system is less than the pressure inside the load lock system has been satisfied.

Preferably, the pressure control method according to the fourth aspect of the present invention further comprises a first pressure monitoring step of monitoring the pressure inside the heat treatment system, after execution of the first communicating step, a COR treatment system exhausting step of exhausting the COR treatment system while continuing to exhaust the heat treatment system such as to satisfy a condition that the pressure inside the heat treatment system is less than pressure inside the COR treatment system, and a second communicating step of terminating the exhaustion of the COR treatment system when the condition that the pressure inside the heat treatment system is less than the pressure inside the COR treatment system has been satisfied, and communicating the heat treatment system with the COR treatment system while continuing to exhaust the heat treatment system.

More preferably, the pressure control method according to the fourth aspect of the present invention further comprises an influx step of introducing fluid into the load lock system and the COR treatment system, after execution of the second communicating step.

Still more preferably, a flow rate of fluid from the load lock system into the heat treatment system, and a flow rate of fluid from the COR treatment system into the heat treatment system are equal to one another.

Also preferably, the pressure control method according to the fourth aspect of the present invention further comprises an exhausting step of exhausting the heat treatment system and the COR treatment, thus setting the pressure inside the COR treatment system to a static elimination pressure for eliminating residual ESC charge, after an object to be processed that has been subjected to the COR treatment has been transferred out from the COR treatment system.

To attain the above object, in a fifth aspect of the present invention, there is provided a pressure control method for a processed object processing apparatus including at least a COR treatment system in which objects to be processed are subjected to COR treatment, and a heat treatment system in which heat treatment is carried out on the objects to be processed that have been subjected to the COR treatment, the method comprising a pressure monitoring step of monitoring pressure inside the heat treatment system while exhausting the heat treatment system a COR treatment system exhausting step of exhausting the COR treatment system such as to satisfy a condition that the pressure inside the heat treatment system is less than pressure inside the COR treatment system, and a communicating step of terminating the exhaustion of the COR treatment system when the condition that the pressure inside the heat treatment system is less than the pressure inside the COR treatment system has been satisfied, and communicating the heat treatment system with the COR treatment system.

To attain the above object, in a sixth aspect of the present invention, there is provided a processed object processing apparatus that processes objects to be processed, comprising a first treatment system in which the objects to be processed are subjected to first treatment, a second treatment system that is communicably connected to the first treatment system and in which the objects to be processed are subjected to second treatment, and a load lock system that is interposed between the first treatment system and the second treatment system and is communicably connected to each of the first treatment system and the second treatment system, the load lock system having a transfer mechanism that transfers the objects to be processed into and out of each of the first treatment system and the second treatment system.

Preferably, the second treatment system is a cooling treatment system in which cooling treatment is carried out on the objects to be processed that have been subjected to the first treatment.

More preferably, the first treatment system is always in a vacuum state, and the second treatment system is always in an atmospheric pressure state.

Still more preferably, the load lock system is disposed in a position such as to form a line with the first treatment system and the second treatment system.

To attain the above object, in a seventh aspect of the present invention, there is provided a processed object processing method for a processed object processing apparatus including at least a load lock system, a vacuum treatment system in which objects to be processed are subjected to vacuum treatment, an atmospheric treatment system in which cooling treatment is carried out on the objects to be processed that have been subjected to the vacuum treatment, and a loader module, the method comprising a load lock system transfer-in step of transferring an object to be processed from the loader module into the load lock system, a first vacuum/atmospheric pressure switching step of evacuating the load lock system after execution of the load lock system transfer-in step, a vacuum treatment system transfer-in step of transferring the object to be processed into the vacuum treatment system after execution of the first vacuum/atmospheric pressure switching step, a vacuum treatment step of carrying out vacuum treatment on the object to be processed that has been transferred into the vacuum treatment system, a load lock system transfer-out step of transferring the object to be processed that has been subjected to the vacuum treatment out into the load lock system, a second vacuum/atmospheric pressure switching step of opening an interior of the load lock system to atmospheric air after execution of the load lock system transfer-out step, an atmospheric treatment system transfer-out step of transferring the object to be processed from the load lock system out into the atmospheric treatment system, an atmospheric treatment step of carrying out cooling treatment on the object to be processed that has been transferred out into the atmospheric treatment system, and a loader module transfer-out step of transferring the object to be processed that has been subjected to the cooling treatment out into the loader module.

To attain the above object, in an eighth aspect of the present invention, there is provided a processed object transfer method for transfer means in a processed object processing apparatus including at least a load lock system having the transfer means which transfers objects to be processed, a vacuum treatment system in which the objects to be processed are subjected to vacuum treatment, a heat treatment system in which heat treatment is carried out on the objects to be processed that have been subjected to the vacuum treatment, and a loader module communicably connected to the load lock system, the method comprising a load lock system transfer-in step of transferring an object to be processed into the load lock system, an evacuating step of evacuating the load lock system after execution of the load lock system transfer-in step, a vacuum treatment system transfer-in step of transferring the object to be processed into the vacuum treatment system after the evacuation in the evacuating step has been completed a vacuum treatment commencing step of commencing vacuum treatment after execution of the vacuum treatment system transfer-in step, a first transfer step of transferring the object to be processed from the vacuum treatment system into the heat treatment system after the vacuum treatment has been completed, a heat treatment commencing step of commencing heat treatment in the heat treatment system, a second transfer step of transferring the object to be processed from the heat treatment system into the load lock system after the heat treatment has been completed, and a loader module transfer-out step of communicating the load lock system and the loader module with one another and transferring the object to be processed out into the loader module.

To attain the above object, in a ninth aspect of the present invention, there is provided a processed object transfer method for transfer means in a processed object processing apparatus including a heat treatment system that has a first stage and in which heat treatment is carried out on an object to be processed which has been placed on the first stage, a vacuum treatment system that has a second stage and in which vacuum treatment is carried out on the object to be processed which has been placed on the second stage, a load lock system that is disposed for communication with the heat treatment system and the vacuum treatment system and has the transfer means which transfers the object to be processed, and a controller that controls the transfer means, the transfer means having a processed object holding part that holds the object to be processed and is freely movable through the heat treatment system and the vacuum treatment system, the processed object holding part having first detecting means for detecting information relating to whether or not the object to be processed is present, at least one of the first stage and the second stage having second detecting means for detecting information relating to whether or not the object to be processed is present, and the controller detecting a position of the object to be processed based on the detected information, the method comprising a first positional relationship detecting step of detecting a first relative positional relationship between a center of the object to be processed in an initial position and a center of one of the first stage and the second stage, a transfer step of determining a transfer route for the object to be processed based on the detected first relative positional relationship, and transferring the object to be processed along the determined transfer route, a second positional relationship detecting step of detecting a second relative positional relationship between the center of the object to be processed after having been transferred to the one of the first stage and the second stage and the center of the object to be processed in the initial position, and a position correcting step of correcting the position of the object to be processed based on a difference between the first relative positional relationship and the second relative positional relationship.

Preferably, the processed object transfer method according to the ninth aspect of the present invention further comprises a processed object holding part rotating step of rotating the processed object holding part while the processed object holding part is still holding the object to be processed, so as to align a position of a reference plane of the object to be processed that has been subjected to the position correction with a predetermined position.

Also preferably, the center of the object to be processed in the initial position is a center of the object to be processed in the load lock system before transfer.

To attain the above object, in a tenth aspect of the present invention, there is provided a processed object transfer method for transfer means in a processed object processing apparatus including a load lock system that is communicably connected to a heat treatment system having a first stage, in which heat treatment is carried out on an object to be processed which has been placed on the first stage, the load lock system being communicably connected, via the heat treatment system, to a vacuum treatment system having a second stage, in which vacuum treatment is carried out on the object to be processed which has been placed on the second stage, the load lock system having the transfer means which transfers the object to be processed, the transfer means comprising a transfer arm that comprises at least two arm-shaped members, the arm-shaped members being rotatably connected together at one end of each thereof, and a processed object holding part that is connected to another end of one of the arm-shaped members and holds the object to be processed, the method comprising a processed object moving step of rotating the processed article holding part in a plane parallel to a surface of the object to be processed about the other end of the one of the arm-shaped members, rotating the one of the arm-shaped members in a plane parallel to the surface of the object to be processed about the one end of the one of the arm-shaped members, and rotating the other one of the arm-shaped members in a plane parallel to the surface of the object to be processed about the other end of the other one of the arm-shaped members.

Preferably, in the processed object moving step, the arm-shaped members and the processed object holding part are rotated in cooperation with one another so as to move the object to be processed along a direction of disposition of the first stage and the second stage.

To attain the above object, in an eleventh aspect of the present invention, there is provided a transfer apparatus that is provided in a load lock system that is communicably connected to a heat treatment system, having a first stage, in which heat treatment is carried out on an object to be processed which has been placed on the first stage, the load lock system being communicably connected, via the heat treatment system, to a vacuum treatment system having a second stage, in which vacuum treatment is carried out on the object to be processed which has been placed on the second stage, the transfer apparatus comprising a transfer arm that comprises at least two arm-shaped members, the arm-shaped members being rotatably connected together at one end of each thereof, and a processed object holding part that is connected to another end of one of the arm-shaped members and holds the object to be processed, and the processed object holding part is disposed to be rotated in a plane parallel to a surface of the object to be processed about the other end of the one of the arm-shaped members, and the one of the arm-shaped members is disposed to be rotated in a plane parallel to the surface of the object to be processed about the one end of the one of the arm-shaped members, and the other one of the arm-shaped members is disposed to be rotated in a plane parallel to the surface of the object to be processed about the other end of the other one of the arm-shaped members.

Preferably, the arm-shaped members and the processed object holding part are disposed to be rotated in cooperation with one another so as to move the object to be processed along a direction of disposition of the first stage and the second stage.

According to the first aspect of the present invention, a plurality of treatment systems in which object to be processed are processed are communicably connected together, and at least one of the treatment systems is a vacuum treatment system. As a result, the operation of transferring the objects to be processed between the treatment systems can be simplified, and hence a plurality of processes including at least one vacuum treatment can be carried out efficiently.

According to the second aspect of the present invention, a COR treatment system in which objects to be processed are subjected to COR treatment, and at least one vacuum treatment system in which the objects to be processed are subjected to other treatment are communicably connected together, and a load lock system is communicably connected to the COR treatment system and the at least one vacuum treatment system. As a result, the operation of transferring the objects to be processed between the COR treatment system and the other treatment system(s) can be simplified, and hence a plurality of processes can be carried out efficiently.

According to the second aspect, a heat treatment system for carrying out heat treatment is preferably connected to the COR treatment system. As a result, heat treatment can be carried out efficiently after the COR treatment.

According to the second aspect, the COR treatment system and the heat treatment system are preferably always in a vacuum state. As a result, the respective treatments in the COR treatment system and the heat treatment system can be carried out one after the other without the vacuum being released, and hence there will be no adsorption of moisture onto the surface of an object to be processed after the COR treatment, and thus an oxide film on the object to be processed can be prevented from undergoing a chemical reaction after the COR treatment.

According to the second aspect, the load lock system is preferably disposed in a position such as to form a line with the COR treatment system and the heat treatment system. As a result, the operation of transferring the objects to be processed in and out can be further simplified, and hence a plurality of processes including the COR treatment and the heat treatment can be carried out yet more efficiently.

According to the third aspect of the present invention, at the same time as carrying out COR treatment in the COR treatment system on an object to be processed, heat treatment can be carried out in the heat treatment system on an object to be processed that has already been subjected to the COR treatment, and moreover an object to be processed that has not been subjected to the COR treatment can be prepared while awaiting completion of the COR treatment. As a result, the COR treatment and the heat treatment can be carried out efficiently, with no wastage of time during the sequence of processes.

According to the fourth aspect of the present invention, before communicating the load lock system and the heat treatment system together, the heat treatment system is exhausted such as to satisfy the condition that the pressure inside the heat treatment system is less than the pressure inside the load lock system, and then the heat treatment system continues to be exhausted thereafter. As a result, the atmosphere in the heat treatment system can be prevented from getting into the load lock system.

According to the fourth aspect, preferably, after communicating the load lock system and the heat treatment system together, the heat treatment system is exhausted such as to satisfy the condition that that the pressure inside the heat treatment system is less than the pressure inside the COR treatment system, and then the heat treatment system and the COR treatment system are communicated together while continuing to exhaust the heat treatment system. As a result, not only can the atmosphere in the heat treatment system be prevented from getting into the load lock system, but moreover the atmosphere in the heat treatment system can be prevented from getting into the COR treatment system.

According to the fourth aspect, a fluid is preferably introduced into the load lock system and the COR treatment system. As a result, convection and so on can be prevented from occurring when evacuating from the heat treatment system.

According to the fourth aspect, the flow rate of the fluid from the load lock system into the heat treatment system and the flow rate of the fluid from the COR treatment system into the heat treatment system are preferably equal to one another. As a result, pressure equilibrium can be maintained in the heat treatment system, and moreover the exhaust flow direction can be fixed.

According to the fourth aspect, after an object to be processed that has been subjected to the COR treatment has been transferred out from the COR treatment system, the heat treatment system and the COR treatment are preferably exhausted, thus setting the pressure inside the COR treatment system to a static elimination pressure for eliminating residual ESC charge. As a result, ESC static elimination can be carried out without the atmosphere inside the heat treatment system getting into the COR treatment system.

According to the fifth aspect of the present invention, before communicating the heat treatment system and the COR treatment system together, the heat treatment system is exhausted such as to satisfy the condition that the pressure inside the heat treatment system is less than the pressure inside the COR treatment system. As a result, the atmosphere in the heat treatment system can be prevented from getting into the COR treatment system.

According to the sixth aspect of the present invention, a first treatment system in which objects to be processed are subjected to first treatment and a second treatment system in which the objects to be processed are subjected to second treatment are communicably connected together, and moreover a load lock system is interposed between the first treatment system and the second treatment system and is communicably connected to each of the first treatment system and the second treatment system. As a result, the operation of transferring the objects to be processed between the first treatment system and the second treatment system can be simplified, and hence a plurality of processes can be carried out efficiently.

According to the sixth aspect, a cooling treatment system for carrying out cooling treatment is preferably connected to the first treatment system via the load lock system. As a result, cooling treatment can be carried out efficiently after the first treatment.

According to the sixth aspect, the cooling treatment is preferably carried out in the second treatment system always in an atmospheric pressure state. As a result, there is no need to carry out switching between a vacuum state and an atmospheric pressure state in the second treatment system, and thus the cooling treatment can be carried out in a short time period; moreover, the load lock system in which switching between a vacuum state and an atmospheric pressure state is carried out need not have a cooling mechanism, and hence the volume of the load lock system can be reduced, and thus the switching between the vacuum state and the atmospheric pressure state can be carried out in a short time period. As a result, the plurality of processes can be carried out more efficiently. Moreover, after having been transferred into the load lock system, an object to be processed (wafer) will not be exposed to air convection due to the switching between a vacuum state and an atmospheric pressure state for a long time period, and hence the risk of attachment of particles caused to fly up by such convection can also be reduced.

According to the sixth aspect, the load lock system is preferably disposed in a position such as to form a line with the first treatment system and the second treatment system. As a result, the operation of transferring the objects to be processed in and out can be further simplified, and hence a plurality of processes including the first treatment and the second treatment can be carried out yet more efficiently.

According to the seventh aspect of the present invention, the second vacuum/atmospheric pressure switching step and the atmospheric treatment step carried out after the object to be processed (wafer) has been subjected to the vacuum treatment are separated. As a result, the total time required for these steps can be reduced, and hence the plurality of processes can be carried out efficiently. Moreover, after the object to be processed (wafer) has been subjected to the vacuum treatment, the atmospheric treatment step is reached only after the load lock system transfer-out step, the second vacuum/atmospheric pressure switching step and the atmospheric treatment system transfer-out step, and hence the cooling of the object to be processed (wafer) proceeds even before the atmospheric treatment step, and thus the cooling treatment in the atmospheric treatment step can be carried out efficiently.

According to the eighth aspect of the present invention, the transfer means transfers an object to be processed into the load lock system, and then, after evacuation of the load lock system has been completed, transfers the object to be processed into the vacuum treatment system, and then, after the vacuum treatment has been completed, transfers the object to be processed from the vacuum treatment system into the heat treatment system, and then, after the heat treatment has been completed, transfers the object to be processed into the load lock system, and then transfers the object to be processed out into the loader module. As a result, the operation of transferring the object to be processed between the treatment systems can be simplified, and hence a plurality of processes including at least one vacuum treatment can be carried out efficiently.

According to the ninth aspect of the present invention, for each stage, a first relative positional relationship between the center of the object to be processed in an initial position and the center of the stage is detected, a transfer route for the object to be processed is determined based on the detected first relative positional relationship, and the object to be processed is transferred along the determined transfer route. As a result, the transfer route to the stage can be set to be short. Moreover, a second relative positional relationship between the center of the object to be processed after having been transferred to the stage and the center of the object to be processed in the initial position is detected, and the position of the object to be processed is corrected based on a difference between the first relative positional relationship and the second relative positional relationship. As a result, the object to be processed can be placed in an accurate position on the stage, and hence the efficiency of the transfer operation can be improved, and thus a plurality of processes can be carried out efficiently.

According to the ninth aspect, the processed object holding part is preferably rotated while the processed object holding part is still holding the object to be processed. As a result, the position of a reference plane of the object to be processed relative to the stage can easily be aligned with a predetermined position, and hence the efficiency of the transfer operation can be further improved.

According to the ninth aspect, the center of the object to be processed in the initial position is preferably the center of the object to be processed in the load lock system before transfer. As a result, the transfer route to each stage can be set to be yet shorter.

According to the tenth aspect of the present invention, the transfer means possessed by the load lock system, which is communicably connected to a heat treatment system and a vacuum treatment system, comprises a transfer arm that comprises at least two arm-shaped members that are rotatably connected together at one end of each thereof, and a processed object holding part that is connected to the other end of one of the arm-shaped members and holds an object to be processed; the processed object holding part is rotated in a plane parallel to a surface of the object to be processed about the other end of the one of the arm-shaped members, and the one of the arm-shaped members is rotated in a plane parallel to the surface of the object to be processed about the one end of the one of the arm-shaped members, and the other one of the arm-shaped members is rotated in a plane parallel to the surface of the object to be processed about the other end of the other one of the arm-shaped members. As a result, the object to be processed can be transferred along a freely chosen transfer route to a freely chosen position in the heat treatment system or the vacuum treatment system, and hence the efficiency of the transfer operation can be improved, and thus a plurality of processes can be carried out efficiently.

According to the tenth aspect, the arm-shaped members and the processed object holding part are preferably rotated in cooperation with one another so as to move the object to be processed along a direction of disposition of the first stage and the second stage. As a result, the processed article transfer route can be made shorter, and hence the efficiency of the transfer operation can be further improved.

According to the eleventh aspect of the present invention, the transfer means, which is provided in a load lock system that is communicably connected to a heat treatment system and a vacuum treatment system, comprises a transfer arm that comprises at least two arm-shaped members that are rotatably connected together at one end of each thereof, and a processed object holding part that is connected to the other end of one of the arm-shaped members and holds an object to be processed; the processed object holding part is rotated in a plane parallel to a surface of the object to be processed about the other end of the one of the arm-shaped members, and the one of the arm-shaped members is rotated in a plane parallel to the surface of the object to be processed about the one end of the one of the arm-shaped members, and the other one of the arm-shaped members is rotated in a plane parallel to the surface of the object to be processed about the other end of the other one of the arm-shaped members. As a result, the object to be processed can be transferred along a freely chosen transfer route to a freely chosen position in the heat treatment system or the vacuum treatment system, and hence the efficiency of the transfer operation can be improved, and thus a plurality of processes can be carried out efficiently.

According to the eleventh aspect, the arm-shaped members and the processed object holding part are preferably rotated in cooperation with one another so as to move the object to be processed along a direction of disposition of the first stage and the second stage. As a result, the processed object transfer route can be made shorter, and hence the efficiency of the transfer operation can be further improved.

The above and other objects, features, and advantages of the invention will become more apparent from the following detailed description taken in conjunction with the accompanying drawings.

BRIEF DESCRIPTION OF THE DRAWINGS

FIGS. 3A and 3B are diagram showing the first half of a processed object transfer sequence for the vacuum treatment apparatus shown in FIG. 1;

FIGS. 4A and 4B are diagram showing the latter half of the transfer sequence, the first half of which is shown in FIGS. 3A and 3B;

DETAILED DESCRIPTION OF THE PREFERRED EMBODIMENTS

The present invention will now be described in detail with reference to the drawings showing preferred embodiments thereof.

Figure 1:
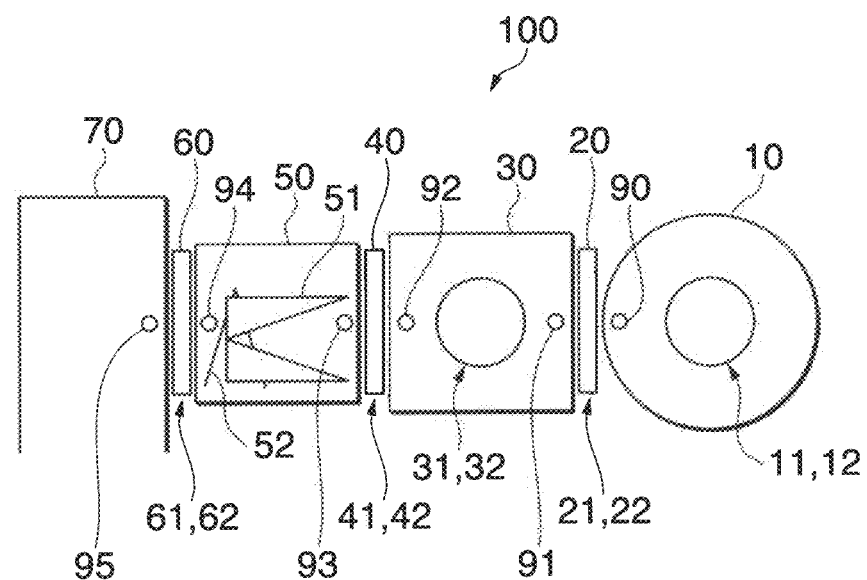
FIG. 1 is a plan view schematically showing the construction of a vacuum treatment apparatus according to a first embodiment of the present invention.
Figure 2:
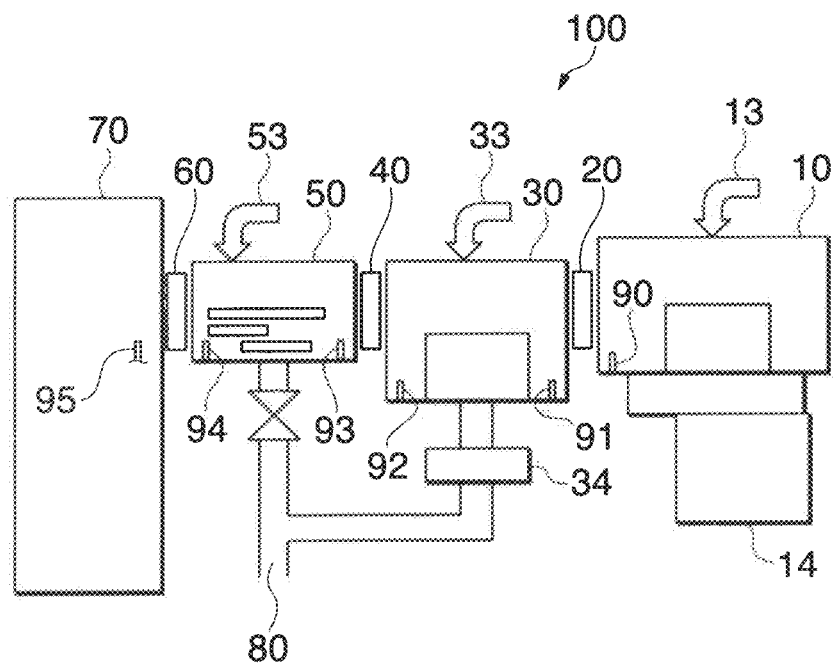
FIG. 2 is a side view schematically showing the construction of the vacuum treatment apparatus shown in FIG. 1.

FIG. 1 is a plan view schematically showing the construction of the vacuum treatment apparatus according to a first embodiment of the present invention. FIG. 2 is a side view schematically showing the construction of the vacuum treatment apparatus shown in FIG. 1.

In FIG. 1, the vacuum treatment apparatus 100 has a first vacuum treatment chamber 10 in which objects to be processed (hereinafter referred to as "processed objects") such as semiconductor wafers are processed, a second vacuum treatment chamber 30 that is connected in a line with and communicably to the first vacuum treatment chamber 10 and in which the processed objects are processed, a load lock chamber 50 that is communicably connected to the second vacuum treatment chamber 30 in a position in a line with the first vacuum treatment chamber 10 and the second vacuum treatment chamber 30, and a loader module 70 that is communicably connected to the load lock chamber 50.

The first vacuum treatment chamber 10 has provided therein a stage 11 on which a processed object is placed when treatment is being carried out, and a processed object holder 12 for carrying out handover of the processed object. As shown in FIG. 2, a gas supply system 13 for supplying $N_2$ gas or the like is connected to the first vacuum treatment chamber 10 at an upper portion thereof, and an exhaust system pressure control valve 14 is attached to the first vacuum treatment chamber 10 at a lower portion thereof. Moreover, a pressure measuring instrument (not shown) for measuring the pressure inside the first vacuum treatment chamber 10 is installed in the first vacuum treatment chamber 10.

A transfer port (not shown) for transferring processed objects into and out of the first vacuum treatment chamber 10 is provided in a side wall of the first vacuum treatment chamber 10. A first transfer port (not shown) is similarly provided in the second vacuum treatment chamber 30. The portion of the first vacuum treatment chamber 10 in which the transfer port is provided and the portion of the second vacuum treatment chamber 30 in which the first transfer port is provided are connected together by a connecting unit 20. The connecting unit 20 is comprised of a gate valve 21 and a thermal insulation unit 22 for isolating the interiors of the first vacuum treatment chamber 10 and the second vacuum treatment chamber 30 from the ambient atmosphere.

The second vacuum treatment chamber 30 has provided therein a stage 31 on which a processed object is placed when treatment is being carried out, and a processed object holder 32 for carrying out handover of the processed object. As shown in FIG. 2, a gas supply system 33 for supplying $N_2$ gas or the like is connected to the first vacuum treatment chamber 30 at an upper portion thereof, and an exhaust system pressure control valve 34 is attached to the first vacuum treatment chamber 30 at a lower portion thereof. Moreover, a pressure measuring instrument (not shown) for measuring the pressure inside the second vacuum treatment chamber 30 is installed in the second vacuum treatment chamber 30.

In addition to the first transfer port described above, a second transfer port (not shown) is also provided in the second vacuum treatment chamber 30. A first transfer port (not shown) is similarly provided in the load lock chamber 50. The portion of the second vacuum treatment chamber 30 in which the second transfer port is provided and the portion of the load lock chamber 50 in which the first transfer port is provided are connected together by a connecting unit 40. The first vacuum treatment chamber 10, the second vacuum treatment chamber 30 and the load lock chamber 50 are thus disposed in a line. The connecting unit 40 is comprised of a gate valve 41 and a thermal insulation unit 42 for isolating the insides of the second vacuum treatment chamber 30 and the environment in the load lock chamber 50 from the ambient atmosphere.

The load lock chamber 50 has provided therein a processed object holding part 51 that holds a processed object during transfer so that handover of the processed object can be carried out, and a transfer mechanism 52 for transferring the processed object holding part 51 into the first vacuum treatment chamber 10, the second vacuum treatment chamber 30 and the loader module 70. Through the transfer mechanism 52 transferring the processed object holding part 51 holding a processed object, the processed object can be transferred between the first vacuum treatment chamber 10, the second vacuum treatment chamber 30 and the loader module 70, and handover of the processed object can be carried out.

As shown in FIG. 2, a gas supply system 53 for supplying $N_2$ gas or the like is connected to the load lock chamber 50 at an upper portion thereof, and an exhaust system 80 is connected to the load lock chamber 50 at a lower portion thereof. Moreover, a pressure measuring instrument (not shown) for measuring the pressure inside the load lock chamber 50 is installed in the load lock chamber 50.

In addition to the first transfer port described above, a second transfer port (not shown) is also provided in the load lock chamber 50. A transfer port (not shown) is similarly provided in the loader module 70. The portion of the load lock chamber 50 in which the second transfer port is provided and the portion of the loader module 70 in which the transfer port is provided are connected together by a connecting unit 60. The connecting unit 60 is comprised of a door valve 61 and a thermal insulation unit 62 for isolating the interiors of the load lock chamber 50 and the environment in the loader module 70 from the ambient atmosphere.

In the construction of the vacuum treatment apparatus 100 described above, there are two vacuum treatment chambers, i.e. a first vacuum treatment chamber 10 and a second vacuum treatment chamber 30, connected together in a line. However, the number of vacuum treatment chambers is not limited to two, but rather three or more vacuum treatment chambers may be connected together in a line.

With the vacuum treatment apparatus 100 described above, a processed object transfer sequence is carried out as will be described later; however, in the case that a processed object is not transferred properly, the processed object transfer sequence must be suspended immediately to prevent the processed object from being subjected to improper treatment. The vacuum treatment apparatus 100 must thus have the ability to accurately grasp the positions of the processed objects being transferred. The vacuum treatment apparatus 100 thus has a plurality of position sensors as described below.

First, component parts with which each processed object comes into direct contact, specifically the stage 31 (or the processed object holder 32), the transfer mechanism 52 (or the processed object holding part 51), and a stage (not shown) provided inside the load lock chamber 50 for temporarily holding the processed objects, each have a position sensor, and using these position sensors it is detected whether or not a processed object is present. Moreover, whether or not a processed object is present is detected according to the status of an ESC chuck provided in the stage 11 inside the first vacuum treatment chamber 10 or using a position sensor. Creating software for detecting the positions of processed objects based on information obtained through the detection would be easy for a person skilled in the art in the field of vacuum treatment apparatuses; through such software, for example, a controller (not shown) that controls the operation of the transfer mechanism 52 and so on can detect the positions of processed objects being transferred through the vacuum treatment apparatus 100.

Furthermore, in the first vacuum treatment chamber 10, the second vacuum treatment chamber 30 and the load lock chamber 50, position sensor units 90, 91, 92, 93, 94 and 95 are provided along the processed object transfer route in positions on either side of each of the gate valves 21 and 41 and the door valve 61. Each of the position sensor units is comprised of three position sensors, for example laser sensors, that point to an outer periphery of the processed object; the laser sensors are radially disposed facing the outer periphery of the processed object, or are disposed in positions corresponding to the outer periphery of the processed object, and not only detect the position of the processed object, but also detect the center position of the processed object.

The controller detects a first relative positional relationship between the center position of a processed object in the load lock chamber 50 before transfer (hereinafter referred to as the "initial position") and the center position of the stage 11 or 31, determines a transfer route for the processed object based on the detected first relative positional relationship, transfers the processed object along the determined transfer route, and then detects a second relative positional relationship between the center position of the processed object that has been transferred to the stage 11 or 31 and the initial position, and corrects the position of the processed object on the stage 11 or 31 based on the difference between the first and second relative positional relationships. As a result, the transfer route to each stage can be set to be short, and moreover each processed object can be placed in an accurate position on each of the stages 11 and 31, and hence the efficiency of the transfer operation can be improved, and thus the plurality of processes can be carried out efficiently.

The transfer mechanism 52 is a transfer arm comprised of an articulated arm of a scalar type single pick type, a scalar type twin pick type or the like. A connecting pulley is disposed at a base portion of the transfer arm, and this connecting pulley is connected to a support pulley disposed at a joint of the arm via a timing belt, whereby a rotational driving force is transmitted to the support pulley. Moreover, the connecting pulley is also connected via another timing belt to a rotational angle pulley possessed by an encoder that detects the rotational angle of the arm.

The encoder electrically stores the rotation starting position of the rotational angle pulley, i.e. the starting position for movement of the transfer arm, as an origin, and moreover detects the moved distance of the transfer arm by detecting the rotational angle of the rotational angle pulley rotatably driven by the other timing belt in the form of a digital signal using a rotational angle sensor, and outputs the detected moved distance as teaching data used in the transfer of a processed object, for example in judging whether or not positioning of the processed object has been carried out accurately.

The vacuum treatment apparatus 100 judges whether or not positioning of a processed object, in particular, positioning of a processed object on the stage 11 or 13, has been carried out accurately, by comparing the position of the processed object detected by the position sensors with the teaching data outputted by the encoder.

Moreover, the transfer arm that serves as the transfer mechanism 52 is comprised of at least two arm-shaped members. The two arm-shaped members are rotatably connected together at one end of each thereof, and the processed object holding part 51 is connected to the other end of one of the two arm-shaped members. Moreover, the processed object holding part 51 rotates in a plane parallel to the surface of the processed object about the other end of the one of the arm-shaped members, and moreover the one of the arm-shaped members rotates in a plane parallel to the surface of the processed object about the one end of the one of the arm-shaped members, and the other arm-shaped member rotates in a plane parallel to the surface of the processed object about the other end of the other arm-shaped member. As a result, each processed object can be transferred along a freely chosen transfer route to a freely chosen position in the second vacuum treatment chamber 30 or the first vacuum treatment chamber 10, and hence the efficiency of the transfer operation can be improved, and thus the plurality of processes can be carried out efficiently.

The two arm-shaped members and the processed object holding part 51 rotate in cooperation with one another so as to move each processed object along a freely chosen transfer route, for example along the direction of disposition of the stages 11 and 13. As a result, the processed object transfer route can be made yet shorter, and hence the operational efficiency can be further improved.

Moreover, over the stage 11 or 31, the processed object holding part 51 rotates while still holding the processed object so as to align the position of an orientation flat (reference plane) of the processed object (wafer) with a predetermined position. As a result, the position of the orientation flat of the wafer relative to the stage 11 or 31 can easily be aligned with the predetermined position, and hence the operational efficiency can be further improved.

Next, a description will be given of a processed object processing method carried out by the vacuum treatment apparatus 100, and a processed object transfer sequence used in this method.

Figure 3A:
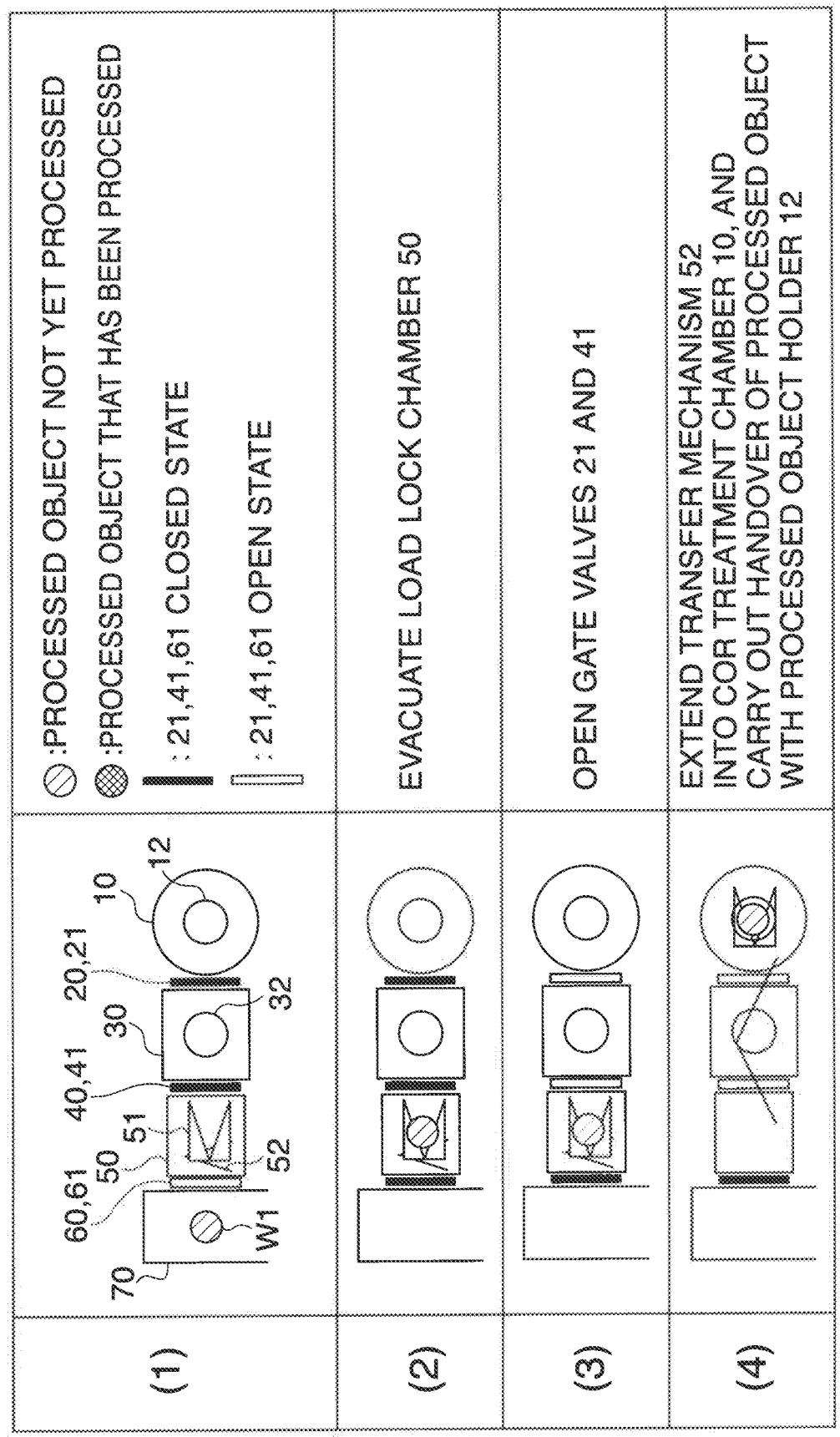
Figure 4B:
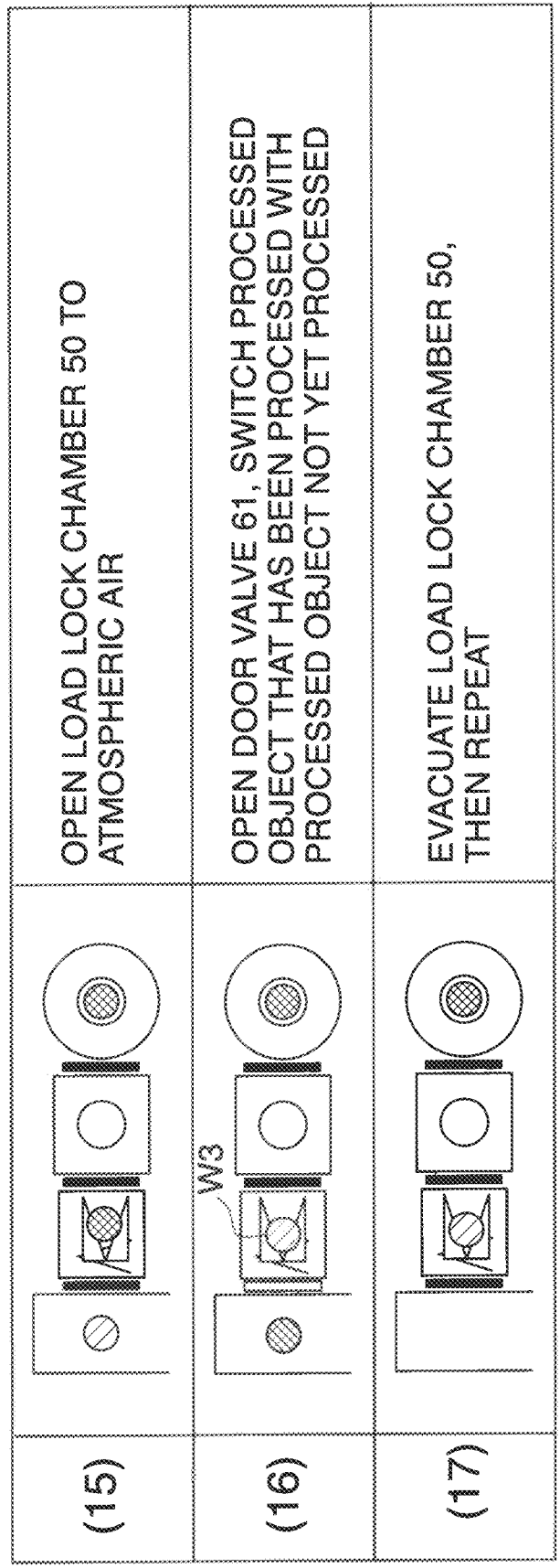

FIGS. 3A and 3B are diagram showing the first half of the processed object transfer sequence for the vacuum treatment apparatus 100 shown in FIG. 1. FIGS. 4A and 4B are diagram showing the latter half of the transfer sequence, the first half of which is shown in FIGS. 3A and 3B.

In the following description, an example is given in which the vacuum treatment apparatus 100 carries out COR (chemical oxide removal) and PHT (post heat treatment) on processed objects as an alternative to conventional etching treatment (dry etching or wet etching). COR is treatment in which gas molecules are subjected to chemical reaction and the products produced are attached to an oxide film on a processed object, and PHT is treatment in which the processed object that has been subjected to the COR is heated, thus subjecting the products produced on the processed object through the chemical reaction in the COR to vaporization and thermal oxidation, and hence driving these products off from the processed object.

Here, in the COR carried out on the processed object, which is comprised of a substrate forming a foundation and a predetermined layer formed on the substrate, an oxide layer (oxide film) or polysilicon exposed after removing a polysilicon layer in gate regions of the predetermined layer is selectively etched; with this COR, the etching rate is controlled such that the progress of the etching stops at the surface of the substrate. Moreover, this COR includes a vapor phase chemical oxide removal process for forming gate openings that can be realized at low pressure by using a vapor of HF and $NH_3$ as an etchant gas.

In the following, the first vacuum treatment chamber 10 is made to be a COR treatment chamber 10 in which the COR is carried out on the processed objects, and the second vacuum treatment chamber 30 is made to be a PHT treatment chamber 30 in which the PHT is carried out on the processed objects. Here, the gas supply system 13 of the COR treatment chamber 10 is preferably a shower head, in which case the introduced gas can be supplied uniformly through the COR treatment chamber 10.

The volume of the COR treatment chamber 10 is approximately 30 liters, the pressure inside the COR treatment chamber 10 is in a range of 0.5 to 30 mTorr, the temperature inside the COR treatment chamber 10 is in a range of 15 to 50° C., and the introduced gas is a fluorine-containing reactive gas, a reducing gas, an inert gas or the like. Inert gases include Ar, He, Ne, Kr and Xe gases, but Ar gas is preferable.

Moreover, the volume of the PHT treatment chamber 30 is approximately 50 liters, and the pressure inside the PHT treatment chamber 30 is reduced in two stages, with the pressure during the processing being different to the pressure during the transfer. Moreover, there is no limitation to reducing the pressure in two stages, but rather multi-stage pressure reduction in which the pressure is reduced in more than two stages may be carried out in accordance with the process conditions. Moreover, the temperature inside the PHT treatment chamber 30 is in a range of 80 to 200° C., and the vacuum pump exhausting rate is in a range of 1600 to 1800 L/min (when at 200 mTorr), and in a range of 0 to 100 L/min when the processing is completed (when at 0.5 mTorr), although once the desired degree of vacuum in the PHT treatment chamber 30 has been attained, the pump is not operated. The gas introduced into the PHT treatment chamber 30 is for preventing scattering of particles and for cooling, and is a downflow gas ($N_2$).

As shown in (1) in FIGS. 3A and 3B, first, a processed object W1 is in the loader module 70, and the connecting units 20 and 40 are in a closed state, and hence the COR treatment chamber 10 and the PHT treatment chamber 30 are isolated from one another. The connecting unit 60, on the other hand, is in an open state. The processed object W1 has already had a predetermined pattern formed on a surface thereof using conventional treatment. As shown in (2), the first processed object W1 is transferred from the loader module 70 into the load lock chamber 50, and then the door valve 61 of the connecting unit 60 is closed. Next, the exhaust system pressure control valve 34 is closed, and the load lock chamber 50 is evacuated. After the evacuation of the load lock chamber 50 has been completed, as shown in (3), the exhaust system pressure control valve 34 is opened, and the gate valve 41 of the connecting unit 40 is opened. After that, the gate valve 21 of the connecting unit 20 is opened.

Next, as shown in (4), the processed object W1 held by the processed object holding part 51 is transferred into the COR treatment chamber 10 by the transfer mechanism 52, and then as shown in (5), after the processed object holding part 51 and the transfer mechanism 52 have returned into the load lock chamber 50, the gate valves 21 and 41 are closed, and the COR is started. During this treatment, the interior of the load lock chamber 50 is opened to the atmospheric air.

Next, as shown in (6) and (7), a second processed object W2 is transferred from the loader module 70 into the load lock chamber 50, and then the door valve 61 is closed, and moreover the exhaust system pressure control valve 34 is closed, and evacuation of the load lock chamber 50 is started. After the evacuation of the load lock chamber 50 has been completed, the exhaust system pressure control valve 34 and the gate valve 41 are opened, and completion of the COR is awaited.

As shown in (8) and (9), after the COR has been completed, the gate valve 21 is opened, and the processed object W1 is moved from the COR treatment chamber 10 into the PHT treatment chamber 30.

Next, as shown in (10) and (11), the processed object W2 is moved from the load lock chamber 50 into the COR treatment chamber 10, and then as shown in (12), after the processed object holding part 51 and the transfer mechanism 52 have returned into the load lock chamber 50, the gate valves 21 and 41 are closed, and the COR is started in the COR treatment chamber 10 while the PHT is started in the PHT treatment chamber 30.

After the PHT has been completed, as shown in (13), the gate valve 41 is opened, and the processed object W1 in the PHT treatment chamber 30 is moved into the load lock chamber 50.

Next, as shown in (14) to (16), the gate valve 41 is closed and the interior of the load lock chamber 50 is opened to the atmospheric air, and then the processed object W1 in the load lock chamber 50 and a third processed object W3 waiting in the loader module 70 are replaced with one another. After that, as shown in (17), the load lock chamber 50 is evacuated. The gate valve 41 is then opened, and completion of the COR on the processed object W2 is awaited. The transfer sequence described above is accompanied by pressure control. The transfer sequence described above is repeated until processing of the whole lot of processed objects is completed.

In each of the steps (1) to (16) in the transfer sequence described above, judgement of the positioning of each processed object based on comparison between the position of the processed object detected by the position sensors described earlier and the teaching data may be carried out, and in the case that positioning of a processed object has not been carried out accurately in a particular step, the transfer of the processed object may be suspended, and the step and the position of the processed object in that step may be stored, whereby the stored data can be utilized as basic data for a re-treatment recipe.

The above is merely an example of the transfer method, but other transfer patterns are also possible, for example, load lock chamber 50→first vacuum treatment chamber 10→load lock chamber 50, load lock chamber 50→second vacuum treatment chamber 30→load lock chamber 50, and load lock chamber 50→second vacuum treatment chamber 30→first vacuum treatment chamber 10→load lock chamber 50.

Furthermore, if necessary back-and-forth movement between the first vacuum treatment chamber 10 and the second vacuum treatment chamber 30 is also possible. By moving a processed object back-and-forth between the COR treatment chamber 10 (first vacuum treatment chamber 10) and the PHT treatment chamber 30 (second vacuum treatment chamber 30), and thus carrying out the COR and the PHT repeatedly, the line width of the pattern formed on the processed object can theoretically be made finer. Pattern miniaturization can thus be coped with.

According to the vacuum treatment apparatus of the first embodiment of the present invention described above, the transfer mechanism 52 transfers the processed object W1 into the load lock chamber 50, and after evacuation of the load lock chamber 50 has been completed, transfers the processed object W1 into the COR treatment chamber 10, and after the COR has been completed, moves the processed object W1 from the COR treatment chamber 10 into the PHT treatment chamber 30, and after the PHT has been completed, moves the processed object W1 in the PHT treatment chamber 30 into the load lock chamber 50, and then further transfers the processed object W1 out into the loader module 70. As a result, the operation of transferring the processed object W1 between the plurality of treatment chambers can be simplified, and hence the plurality of processes including at least one COR treatment can be carried out efficiently.

Moreover, according to the vacuum treatment apparatus of the first embodiment, in the case that the following process condition is satisfied, a sequence of two treatments can be carried out efficiently, without making the first vacuum treatment chamber 10 wait.

Process condition: (First treatment duration)≥(Second treatment duration)+(First switching duration)+(Second switching duration)+(Duration of gas charging/exhausting for load lock chamber 50)

Here:

First treatment duration=Duration of treatment in first vacuum treatment chamber 10 Second treatment duration=Duration of treatment in second vacuum treatment chamber 30

First switching duration=Time period taken to replace processed objects between load lock chamber 50 and second vacuum treatment chamber 30

Second switching duration: Time period taken to switch processed objects between load lock chamber 50 and loader module 70

The first vacuum treatment chamber 10 and the second vacuum treatment chamber 30 can be comprised of a suitable combination of required modules selected from etching systems, film formation systems, coating systems, measurement systems, heat treatment systems and so on, with there being no limitation to the example described above.

Moreover, in the case that the first vacuum treatment chamber 10 and the second vacuum treatment chamber 30 are always in a vacuum state, there will be no instances in which the second vacuum treatment chamber 30 and the load lock chamber 50 are evacuated simultaneously, and hence in this case the second vacuum treatment chamber 30 and the load lock chamber 50 may share the same exhaust system 80.

Next, a description will be given of the pressure control during the operation of the vacuum treatment apparatus 100.

Figure 5:
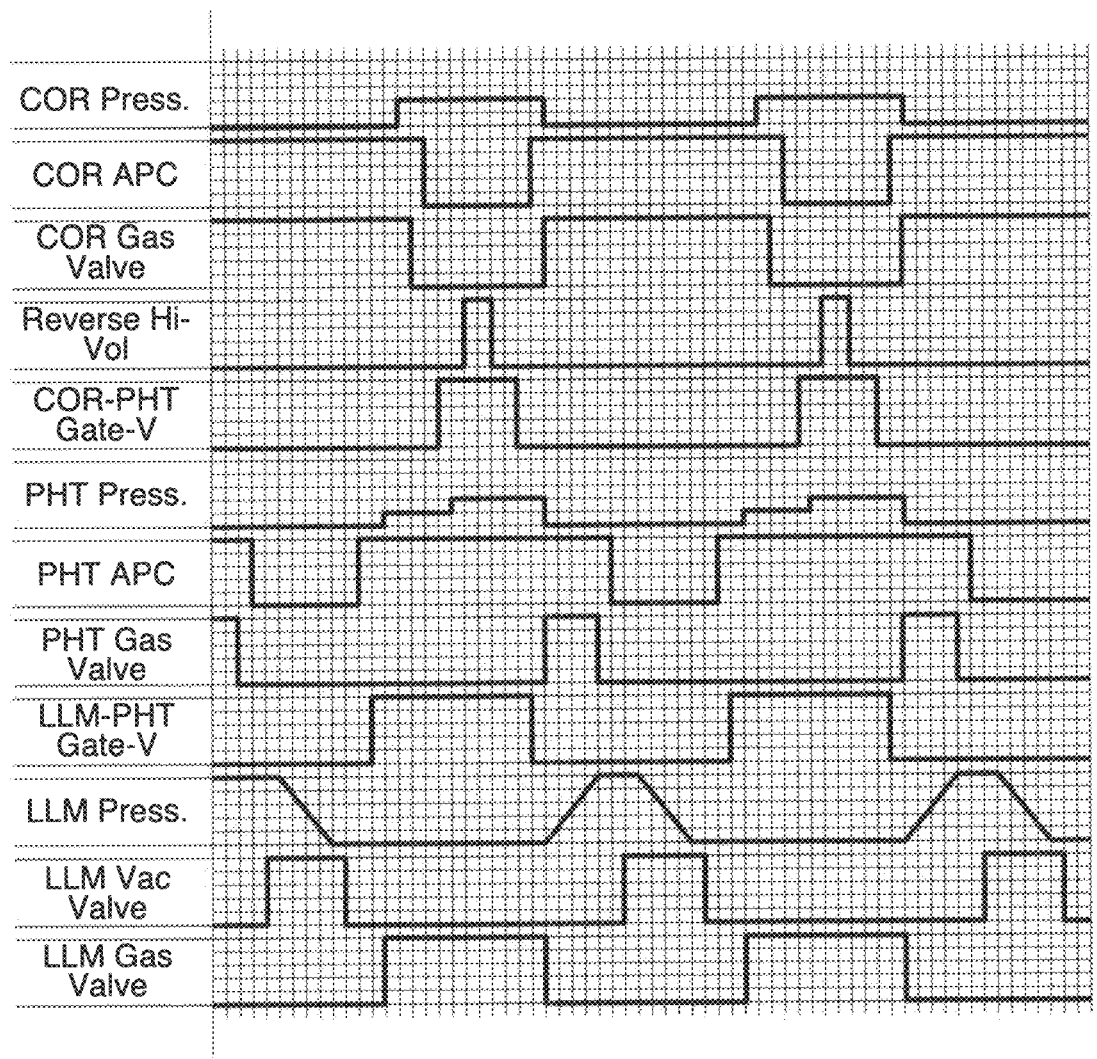
FIG. 5 is a diagram showing a timing chart for pressure control in the vacuum treatment apparatus shown in FIG. 1.

FIG. 5 is a diagram showing a timing chart for the pressure control in the vacuum treatment apparatus 100.

1) While the PHT treatment chamber 30 is being evacuated, the interior of the load lock chamber 50 is opened to the atmospheric air and a processed object that has not been subjected to COR is transferred from the loader module 70 into the load lock chamber 50, and then the exhaust system pressure control valve 34 (hereinafter referred to as the "PHT exhaust valve 34") attached to the PHT treatment chamber 30 is closed, thus starting evacuation of the load lock chamber 50.

Once the load lock chamber 50 has reached a set pressure, an exhaust valve of the load lock chamber 50 (LLM exhaust valve, not shown in FIG. 1 or 2) is closed, the PHT exhaust valve 34 is opened, and control is carried out such that the pressure inside the PHT treatment chamber 30 becomes less than the pressure inside the load lock chamber 50; once it has been confirmed that this control has been completed, the gate valve 41 (hereinafter referred to as the "PHT-side gate valve 41") between the load lock chamber 50 and the PHT treatment chamber 30 is opened, thus communicating the PHT treatment chamber 30 to the load lock chamber 50.

The PHT exhaust valve 34 is kept open even after the PHT-side gate valve 41 has been opened, thus evacuating the PHT treatment chamber 30 and hence preventing the PHT atmosphere from getting into the load lock chamber 50. Moreover, a fluid ($N_2$) may be deliberately made to flow in from the load lock chamber 50 to prevent convection and so on from occurring.

2) The pressure inside the PHT treatment chamber 30 is monitored while evacuating the PHT treatment chamber 30, and the pressure inside the COR treatment chamber 10 is controlled such that the pressure inside the PHT treatment chamber 30 is less than the pressure inside the COR treatment chamber 10.

Once the pressure inside the PHT treatment chamber 30 has become less than the pressure inside the COR treatment chamber 10, the exhaust system pressure control valve 14 (hereinafter referred to as the "COR exhaust valve 14") attached to the COR treatment chamber 10 is closed, and the gate valve 21 (hereinafter referred to as the "COR-side gate valve 21") between the PHT treatment chamber 30 and the COR treatment chamber 10 is opened.

The PHT exhaust valve 34 is kept open even after the COR-side gate valve 21 has been opened, thus evacuating the PHT treatment chamber 30 and hence preventing the atmosphere inside the PHT treatment chamber 30 from getting into the COR treatment chamber 10. Moreover, a fluid ($N_2$) may be deliberately made to flow in from the COR treatment chamber 10 to prevent convection and so on from occurring.

3) The PHT-side gate valve 41 is opened using the sequence described in 1) above, and then taking the load lock chamber 50 and the PHT treatment chamber 30 to be a single module, the COR-side gate valve 21 is opened using the sequence described in 2) above. The PHT exhaust valve 34 is kept open even after the PHT-side gate valve 41 and the COR-side gate valve 21 have been opened, thus evacuating the PHT treatment chamber 30 and hence preventing the atmosphere inside the PHT treatment chamber 30 from getting into the load lock chamber 50 or the COR treatment chamber 10.

Moreover, a fluid ($N_2$) may be deliberately made to flow into the load lock chamber 50 and the COR treatment chamber 10 to prevent convection and so on from occurring, and by making the flow rate of the fluid into the PHT treatment chamber 30 from the load lock chamber 50 be equal to that from the COR treatment chamber 10, backflow can be prevented from occurring.

4) In the sequence described in 3) above, after the processed object that has been subjected to the COR has been transferred out from the COR treatment chamber 10, the pressure inside the COR treatment chamber 10 is controlled using the PHT exhaust valve 34 to a static elimination pressure to eliminate residual ESC charge. As a result, ESC static elimination can be carried out without the atmosphere inside the PHT treatment chamber 30 getting into the COR treatment chamber 10.

Moreover, the treatment in the PHT treatment chamber 30 and the COR treatment chamber 10 can be carried out continuously always in a vacuum state, and hence a chemical reaction in which the oxide film on the processed object after the COR absorbs moisture from the atmosphere or the like can be prevented from occurring.

In the transfer method described above, wafers that will be used as products (i.e. product wafers) were transferred as the processed objects; however, the transferred processed objects are not limited to product wafers, but rather may also be dummy wafers for inspecting the operation of the treatment chambers and devices of the vacuum treatment apparatus 100, or other dummy wafers used in seasoning the treatment chambers.

Next, a description will be given of a vacuum treatment apparatus according to a second embodiment of the present invention, with reference to the drawings.

Figure 6:
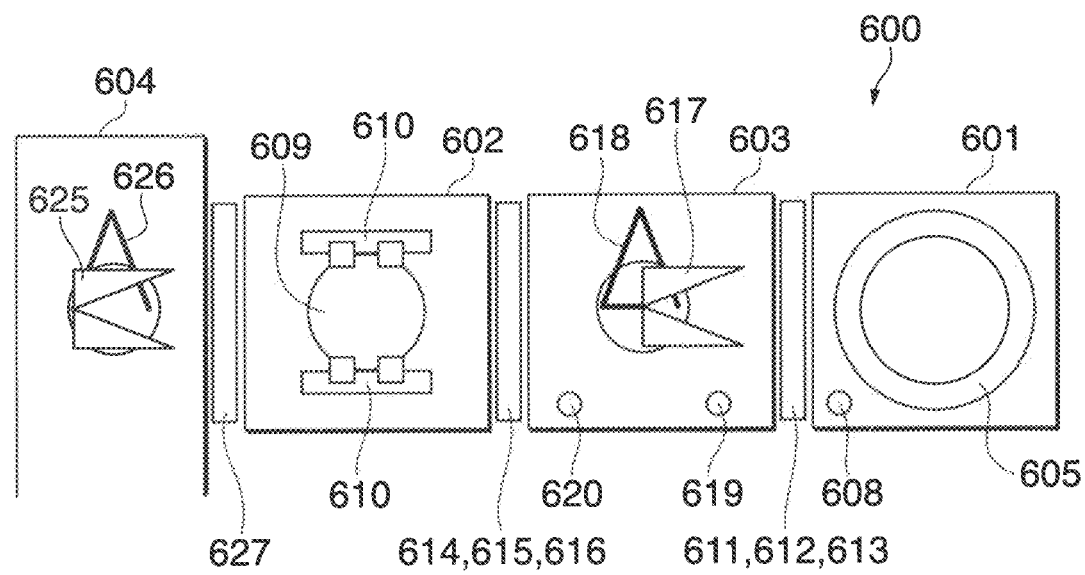
FIG. 6 is a plan view schematically showing the construction of a vacuum treatment apparatus according to a second embodiment of the present invention.
Figure 7:
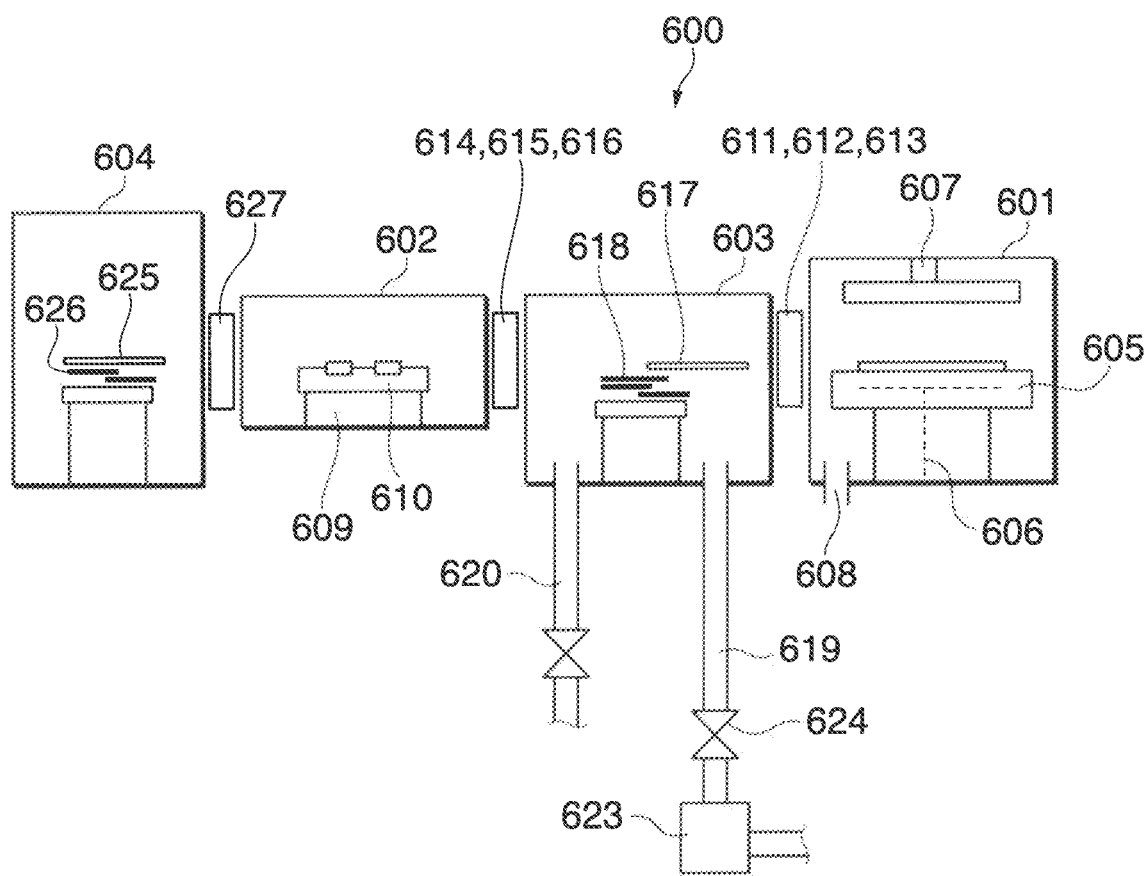
FIG. 7 is a side view schematically showing the construction of the vacuum treatment apparatus shown in FIG. 6.

FIG. 6 is a plan view schematically showing the construction of the vacuum treatment apparatus according to the second embodiment of the present invention. FIG. 7 is a side view schematically showing the construction of the vacuum treatment apparatus shown in FIG. 6.

In FIG. 6, the vacuum treatment apparatus 600 has a vacuum treatment chamber 601 in which processed objects are subjected to vacuum treatment, an atmospheric treatment chamber 602 that is connected in a line with and communicably to the vacuum treatment chamber 601 and in which the processed objects are subjected to other treatment, a load lock chamber 603 that is situated between the vacuum treatment chamber 601 and the atmospheric treatment chamber 602 and is communicably connected to the vacuum treatment chamber 601 and the atmospheric treatment chamber 602 in a position such as to form a line with the vacuum treatment chamber 601 and the atmospheric treatment chamber 602, and a loader module 604 that is communicably connected to the atmospheric treatment chamber 602.

The vacuum treatment chamber 601 has provided therein a stage 605 that serves both as a platform on which to place a processed object and as a lower electrode to which is applied a high-frequency voltage for generating plasma inside the vacuum treatment chamber 601 when carrying out treatment, a heater 606 that is built into the stage 605 and heats the processed object placed on the stage 605, a shower head 607 that serves both as a supply system that supplies a reactive gas into the vacuum treatment chamber 601 and as an upper electrode for generating a high-frequency electric field inside the vacuum treatment chamber 601 in cooperation with the stage 605 that serves as the lower electrode, a discharge port 608 that has a freely openable/closable valve (not shown) and from which the plasma and product residue generated inside the vacuum treatment chamber 601 are discharged, and a pressure measuring instrument (not shown) for measuring the pressure inside the vacuum treatment chamber 601. The interior of the vacuum treatment chamber 601 is always in a vacuum state, and here is in a state such that vacuum treatment can be carried out.

A transfer port (not shown) for transferring processed objects into and out of the first vacuum treatment chamber 601 is provided in a side wall of the vacuum treatment chamber 601. A transfer port (not shown) is similarly provided in a side wall of the load lock chamber 603 disposed adjacent to the vacuum treatment chamber 601. The portions of the vacuum treatment chamber 601 and the load lock chamber 603 in which the transfer ports are provided are connected together by a connecting unit 611. The connecting unit 611 is comprised of a gate valve 612 and a thermal insulation unit 613 for isolating the interiors of the vacuum treatment chamber 601 and the environment in the load lock chamber 603 from the ambient atmosphere.

The atmospheric treatment chamber 602 has provided therein a stage 609 on which a processed object is placed, and a holder 610 that holds the processed object placed on the stage 609. The stage 609 has built therein a cooling circuit (not shown) as a cooling mechanism through which a coolant can circulate, whereby the processed object placed on the stage 609 is cooled. Moreover, the interior of the atmospheric treatment chamber 602 is always opened to the atmospheric air. Therefore, cooling treatment in which a processed object that has been heated during CVD or the like is cooled can thus be carried out at atmospheric pressure in the atmospheric treatment chamber 602.

Moreover, as a cooling mechanism, in addition to the cooling circuit described above, the atmospheric treatment chamber 602 may have an inlet port through which a downflow gas for cooling, for example an inert gas such as $N_2$, Ar or He gas, is introduced into the atmospheric treatment chamber 602.

A transfer port (not shown) for transferring processed objects into and out of the atmospheric treatment chamber 602 is provided in a side wall of the atmospheric treatment chamber 602. In addition to the transfer port described earlier, another transfer port (not shown) is similarly provided in a side wall of the load lock chamber 603 disposed adjacent to the atmospheric treatment chamber 602. The portions of the atmospheric treatment chamber 602 and the load lock chamber 603 in which the transfer ports are provided are connected together by a connecting unit 614. As a result, the vacuum treatment chamber 601, the load lock chamber 603 and the atmospheric treatment chamber 602 are disposed so as to form a line in this order. The connecting unit 614 is comprised of a gate valve 615 and a thermal insulation unit 616 for isolating the interiors of the atmospheric treatment chamber 602 and the environment in the load lock chamber 603 from the ambient atmosphere.

The load lock chamber 603 has provided therein a processed object holding part 617 that holds a processed object during transfer so that handover of the processed object can be carried out, and a transfer mechanism 618 for transferring the processed object holding part 617 into the vacuum treatment chamber 601 and the atmospheric treatment chamber 602. Through the transfer mechanism 618 transferring the processed object holding part 617 holding a processed object, the processed object can be transferred between the vacuum treatment chamber 601 and the atmospheric treatment chamber 602, and handover of the processed object can be carried out. Moreover, the volume inside the load lock chamber 603 is set such as to secure the minimum space required such that the operation of the transfer mechanism 618 will not be hampered.

As shown in FIG. 7, a pipe 619 that communicates the interior of the load lock chamber 603 to the outside is provided in the load lock chamber 603 at a lower portion thereof. An evacuating pump 623 such as a turbo-molecular pump, and a valve 624 that enables the interior of the load lock chamber 603 and the evacuating pump 623 to be communicated with one another or shut off from one another are disposed in the pipe 619. Moreover, a pressure measuring instrument (not shown) for measuring the pressure inside the load lock chamber 603 is installed in the load lock chamber 603. Furthermore, a gas supply system 620 for supplying $N_2$ gas or the like is connected to the load lock chamber 603 at a lower portion thereof. The load lock chamber 603 thus has a construction according to which the interior thereof can be switched between a vacuum state and atmospheric pressure using the pipe 619 and the gas supply system 620.

The loader module 604 has provided therein a processed object holding part 625 and a transfer mechanism 626 similar to the processed object holding part 617 and the transfer mechanism 618 described above. Using the processed object holding part 625 and the transfer mechanism 626, a processed object can be transferred between a processed object carrier (not shown) installed in the loader module 604 and the atmospheric treatment chamber 602, and handover of the processed object can be carried out.

A transfer port (not shown) is provided in a side wall of the loader module 604. Moreover, in addition to the transfer port described earlier, another transfer port (not shown) is similarly provided in a side wall of the atmospheric treatment chamber 602 disposed adjacent to the loader module 604. The portions of the loader module 604 and the atmospheric treatment chamber 602 in which the transfer ports are provided are connected together by a connecting unit 627.

In the construction of the vacuum treatment apparatus 600 described above, there are two treatment chambers, i.e. a vacuum treatment chamber 601 and an atmospheric treatment chamber 602, connected together in a line. However, as with the vacuum treatment apparatus 100 according to the first embodiment of the present invention, the number of treatment chambers is not limited to two, but rather three or more treatment chambers may be connected together in a line.

Next, a description will be given of a processed object processing method carried out by the vacuum treatment apparatus 600, and a processed object transfer sequence used in this method.

Figure 8A:
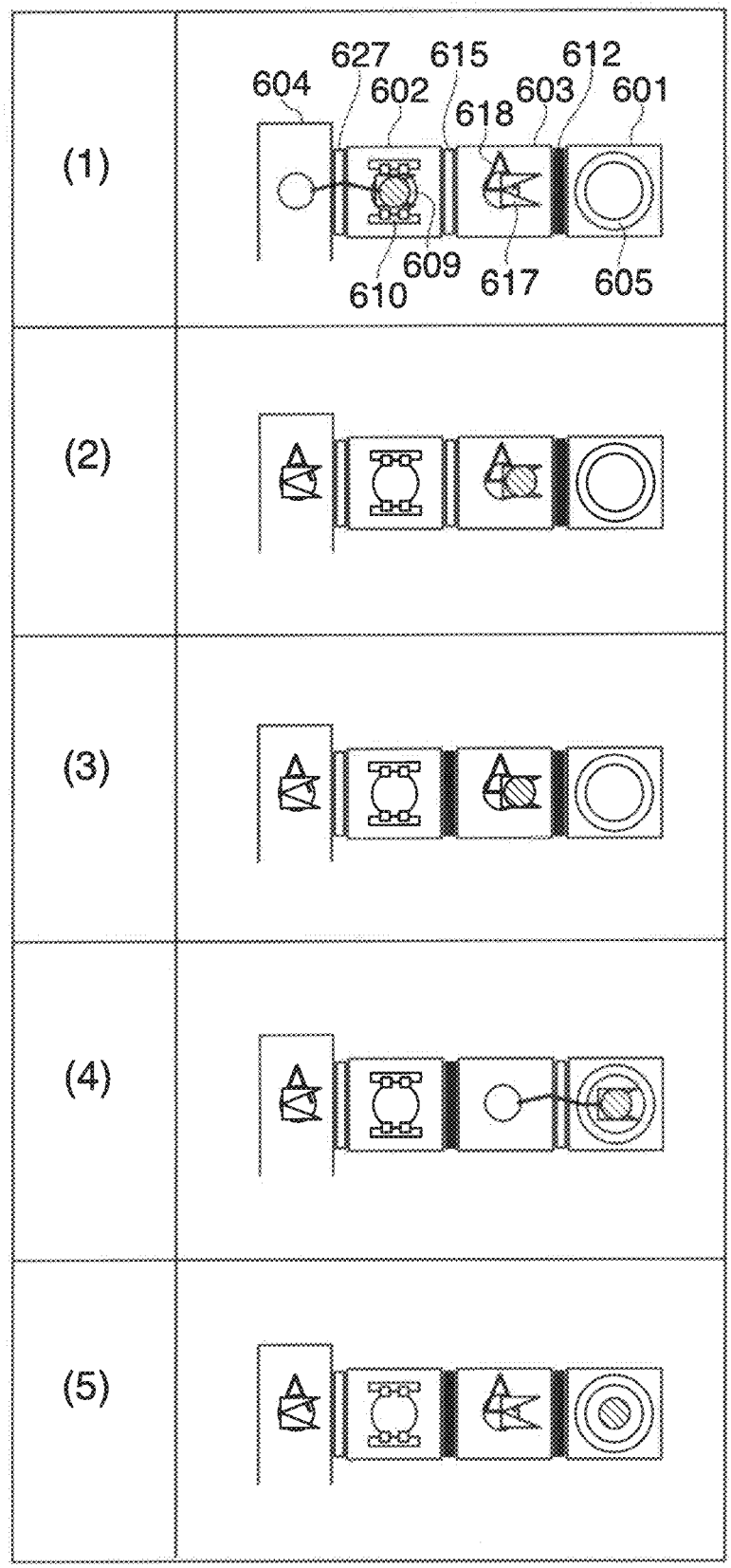
FIGS. 8A and 8B are diagram showing a processed object transfer sequence for the vacuum treatment apparatus shown in FIG. 6.
Figure 8B:
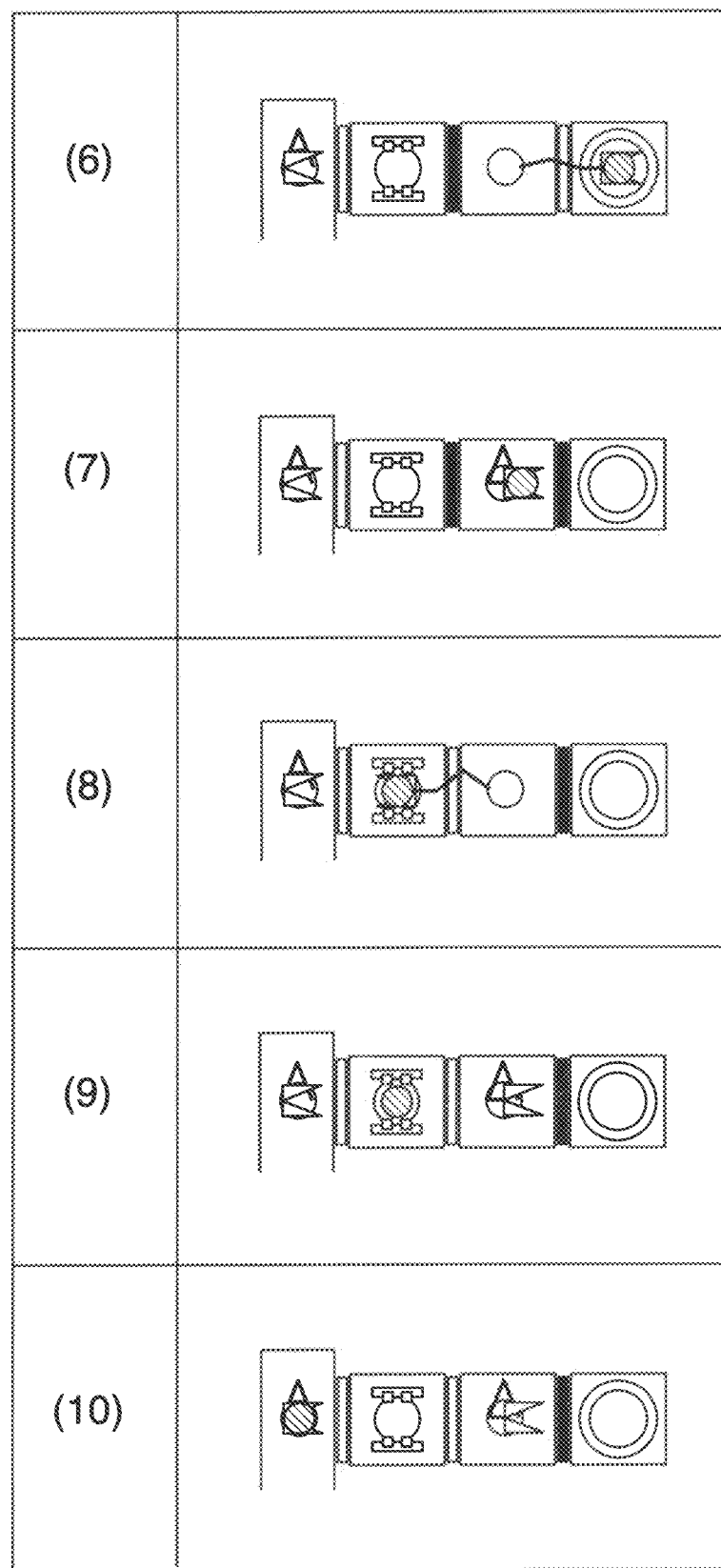

FIGS. 8A and 8B are diagram showing the processed object transfer sequence for the vacuum treatment apparatus 600 shown in FIG. 6.

In the following description, an example is given in which the vacuum treatment apparatus 600 carries out CVD and cooling on processed objects.

In the following, the vacuum treatment chamber 601 is made to be a CVD treatment chamber 601 in which CVD is carried out on the processed objects, and in the atmospheric treatment chamber 602, cooling is carried out on the processed objects as atmospheric treatment. In FIGS. 8A and 8B, as in FIGS. 3A to 4B, a connecting unit being white indicates that the gate valve is in an open state, and a connecting unit being black indicates that the gate valve is in a closed state.

First, as shown in (1) in FIGS. 8A and 8B, a processed object W1 in the loader module 604 is transferred into the atmospheric treatment chamber 602. At this time, the gate valve 612 is in a closed state, and hence the load lock chamber 603 and the CVD treatment chamber 601 are isolated from one another. The gate valve 615, on the other hand, is in an open state, and hence the atmospheric treatment chamber 602 and the load lock chamber 603 are communicated with one another.

Next, as shown in (2), the processed object W1 is transferred from the atmospheric treatment chamber 602 into the load lock chamber 603, and then as shown in (3), the gate valve 615 is closed, and moreover the valve 624 in the pipe 619 is opened, and then the evacuating pump 623 is operated, thus evacuating the load lock chamber 603.

Next, as shown in (4), the gate valve 612 is opened, and then the processed object W1 held by the processed object holding part 617 is transferred into the CVD treatment chamber 601 by the transfer mechanism 618. Then, as shown in (5), after the processed object holding part 617 and the transfer mechanism 618 have returned into the load lock chamber 603, the gate valve 612 is closed, and the processed object W1 is subjected to CVD in the CVD treatment chamber 601.

Next, as shown in (6), after the CVD has been completed, the gate valve 612 is opened, and the processed object W1 that has been subjected to the CVD is transferred out from the CVD treatment chamber 601 into the load lock chamber 603.

Next, as shown in (7), after the processed object W1 has been transferred out into the load lock chamber 603, the gate valve 612 is closed, and moreover the valve 624 in the pipe 619 is closed, and supply of $N_2$ gas or the like from the gas supply system 620 is commenced, thus releasing the interior of the load lock chamber 603 to the atmospheric air. Once the pressure inside the load lock chamber 603 has reached atmospheric pressure, as shown in (8), the gate valve 615 is opened, and then the processed object W1 is transferred by the transfer mechanism 618 into the atmospheric treatment chamber 602, placed on the stage 609, and held by the holder 610.

Next, as shown in (9), the stage 609 cools the processed object W1, and once the processed object W1 has been cooled to a predetermined temperature (approximately 70° C.), as shown in (10), the processed object W1 is transferred out into the loader module 604.

The vacuum treatment apparatus 600 then repeats the transfer sequence described above until processing of the whole lot of processed objects is completed.

In each of the steps (1) to (10) in the transfer sequence described above, as described for the first embodiment of the present invention, judgement of the positioning of each processed object based on comparison between the position of the processed object detected by the position sensors and the teaching data may be carried out, and in the case that positioning of a processed object has not been carried out accurately in a particular step, the transfer of the processed object may be suspended, and the step and the position of the processed object in that step may be stored, and the stored data may be utilized, whereby the stored data can be utilized as basic data for a re-treatment recipe.

Moreover, with the vacuum treatment apparatus according to the second embodiment, as described for the first embodiment of the present invention, again it is possible to detect a first relative positional relationship between the center position of the stage 605 or 609 and the initial position based on the information obtained by the position sensors, determine a transfer route for the processed object based on the detected first relative positional relationship, transfer the processed object along the determined transfer route, and then detect a second relative positional relationship between the center position of the processed object that has been transferred to the stage 605 or 609 and the initial position, and correct the position of the processed object on the stage 605 or 609 based on the difference between the first and second relative positional relationships. As a result, effects as described earlier can be achieved.

Moreover, the transfer mechanism 618 and the processed object holding part 617 may have the same structure as that of the transfer mechanism 52 and the processed object holding part 51 in the first embodiment, whereby effects as described earlier can be achieved.

The above is merely an example of the transfer sequence, and with other transfer sequences back-and-forth movement between the vacuum treatment chamber 601 and the atmospheric treatment chamber 602 may be carried out if required. By moving the processed object W1 back-and-forth between the CVD treatment chamber 601 (vacuum treatment chamber 601) and the atmospheric treatment chamber 602, and thus carrying out the CVD and the cooling repeatedly, variation in the thickness of the thin film formed on the surface of the processed object W1 can be suppressed.

Moreover, the vacuum treatment chamber 601 and the atmospheric treatment chamber 602 can be comprised of a suitable combination of required modules selected from etching systems, film formation systems, coating/developing systems, measurement systems, heat treatment systems and so on, with there being no limitation to the example described above.

According to the vacuum treatment apparatus of the second embodiment of the present invention described above, the CVD treatment chamber 601 in which the processed object W1 is subjected to CVD and the atmospheric treatment chamber 602 in which the processed object W1 is subjected to cooling are communicably connected together, and the load lock chamber 603 is disposed between the CVD treatment chamber 601 and the atmospheric treatment chamber 602 in a position such as to form a line with the vacuum treatment chamber 601 and the atmospheric treatment chamber 602 and is communicably connected to the vacuum treatment chamber 601 and the atmospheric treatment chamber 602. As a result, the operation of transferring the processed object W1 between the CVD treatment chamber 601 and the atmospheric treatment chamber 602 can be simplified, and hence the plurality of processes including CVD treatment and cooling treatment can be carried out efficiently, and in particular the cooling treatment can be carried out efficiently after the CVD treatment on the processed object W1.

Moreover, the cooling treatment in the atmospheric treatment chamber 602 is always carried out in an atmospheric pressure state, and hence there is no need to carry out switching between a vacuum state and an atmospheric pressure state in the atmospheric treatment chamber 602, and thus the cooling treatment can be carried out in a short time period; moreover, the load lock chamber 603 in which switching between a vacuum state and an atmospheric pressure state is carried out need not have a cooling mechanism, and hence the volume of the load lock chamber 603 can be reduced, and thus the switching between the vacuum state and the atmospheric pressure state can be carried out in a short time period. As a result, the plurality of processes including the cooling treatment carried out on the processed object W1 and the switching between a vacuum state and an atmospheric pressure state can be carried out more efficiently.

If, for example, the switching between a vacuum state and an atmospheric pressure state and the cooling treatment are carried out simultaneously as with the conventional vacuum treatment apparatus, then the load lock chamber must contain not only a transfer mechanism but also a cooling mechanism, and hence the volume of the load lock chamber is increased, and hence it has been found that approximately 126 seconds is required for the switching between a vacuum state and an atmospheric pressure state and the cooling treatment; however, in the case that the switching between a vacuum state and an atmospheric pressure state and the cooling treatment are carried out in separate treatment chambers as with the vacuum treatment apparatus according to the second embodiment of the present invention described above, only the switching between a vacuum state and an atmospheric pressure state needs to be carried out in the load lock chamber, and only the cooling treatment needs to be carried out in the atmospheric treatment chamber, and hence the volume of the load lock chamber is reduced, and thus only approximately 20 seconds is required for the switching between a vacuum state and an atmospheric pressure state, and only approximately 15 seconds is required for the cooling treatment, i.e. only a total of approximately 35 seconds is required for the switching between a vacuum state and an atmospheric pressure state and the cooling treatment.

Furthermore, after having been transferred into the load lock chamber 603, the processed object W1 is not exposed to air convection due to the switching between a vacuum state and an atmospheric pressure state for a long time period, and hence the risk of attachment of particles caused to fly up by such convection can be reduced.

Moreover, according to the processed object processing method of the second embodiment the switching between a vacuum state and an atmospheric pressure state and the cooling treatment after the processed object W1 has been subjected to the CVD treatment are divided between the load lock chamber 603 and the atmospheric treatment chamber 602, and hence the time period taken for each of these processes can be shortened, and thus the plurality of processes including the switching between a vacuum state and an atmospheric pressure state and the cooling treatment can be carried out efficiently. Moreover, after the processed object W1 has been subjected to the CVD treatment, the cooling treatment in the atmospheric treatment chamber 602 is carried out after a process of transferring the processed object W1 out into the load lock chamber 603, a process of switching between a vacuum state and an atmospheric pressure state in the load lock chamber 603, and a process of transferring the processed object W1 out into the atmospheric treatment chamber 602; cooling of the processed object W1 thus proceeds even before the cooling treatment is carried out, for example in the case that the temperature of the processed object W1 immediately after the CVD is approximately 650° C., it has been found that the temperature of the processed object W1 after the process of transferring the processed object W1 out into the atmospheric treatment chamber 602 is approximately 400° C. As a result, the cooling treatment carried out on the processed object W1 in the atmospheric treatment chamber 602 can be carried out efficiently.

With the vacuum treatment apparatus according to the second embodiment described above, CVD was carried out on the processed object; however, it goes without saying that the vacuum treatment carried out on the processed object by the vacuum treatment apparatus is not limited to CVD, but rather any vacuum treatment that is accompanied by heat treatment may be carried out, and effects as described above can be achieved in this case as well.

The invention claimed is:

1. A processed object processing method applied to a processed object processing apparatus, the processed object processing apparatus comprising first and second treatment chambers that are communicably and adjacently connected to each other and in which objects to be processed are processed, one load lock chamber that is communicably and adjacently connected to the second treatment chamber, has a transfer arm located therein which transfers the objects to be processed into and out of each of the first and second treatment chambers, and has a processed object holding part holding the objects to be processed, a first gate valve that isolates interiors of the first and second treatment chambers from each other, and a second gate valve that isolates interiors of the second treatment chamber and the one load lock chamber from each other, the second treatment chamber comprised of a vacuum treatment chamber which drives products off from the objects to be processed, the one load lock chamber and the first and second treatment chambers aligned in the same straight line, the transfer arm capable of entering into both the first and second treatment chambers such that the transfer arm can transfer directly the object to be processed to the first and second treatment chambers, the processed object processing method comprising:

a first communication step of opening the first gate valve so as to communicate the first and second treatment chambers with each other once a pressure inside the first treatment chamber has become more than a pressure inside the second treatment chamber while evacuating the second treatment chamber; and a second communication step of opening the second gate valve so as to communicate the one load lock chamber and the second treatment chamber with each other once a pressure inside the one load lock chamber has become more than the pressure inside the second treatment chamber while evacuating the second treatment chamber, wherein a gas is deliberately made to flow in the second treatment chamber from the first treatment chamber during said first communication step, and wherein following process condition is satisfied, a first treatment duration in the first treatment chamber is equal to or greater than a summation of a second treatment duration in the second treatment chamber and a first switching duration and a second switching duration and a duration of gas charging/exhausting for the one load lock chamber, where the first treatment duration is a duration of treatment of the processed object in the first treatment chamber, the second treatment duration is a duration of treatment of the processed object in the second treatment chamber, the first switching duration is a first time period taken to replace the processed object between the one load lock chamber and the second treatment chamber, and the second switching duration is a second time period taken to switch the processed object between the one load lock chamber and an atmospheric transferring chamber connected to the one load lock chamber.

2. A processed object processing method as claimed in claim 1, further comprising a first treatment chamber transfer step of transferring directly an object to be processed into the first treatment chamber by the transfer arm while the second treatment chamber houses another object to be processed therein.

3. A processed object processing method as claimed in claim 1, further comprising a second treatment chamber transfer step of transferring directly an object to be processed out of the first treatment chamber into the second treatment chamber by the transfer arm while the one load lock chamber houses another object to be processed therein.

4. A processed object processing method applied to a processed object processing apparatus, the processed object processing apparatus comprising a COR (chemical oxide removal) treatment chamber in which objects to be processed are subjected to COR treatment, a vacuum treatment chamber which drives products off from the objects to be processed and is communicably and adjacently connected to the COR treatment chamber, one load lock chamber which is communicably and adjacently connected to the vacuum treatment chamber, has a transfer arm located therein that transfers the objects to be processed into and out of each of the COR treatment chamber and the vacuum treatment chamber, and has a processed object holding part holding the object to be processed, a first gate valve which isolates interiors of the COR treatment chamber and the vacuum treatment chamber from each other, and a second gate valve which isolates interiors of the vacuum treatment chamber and the one load lock chamber from each other, the one load lock chamber, the COR treatment chamber and the vacuum treatment chamber aligned in the same straight line, the transfer arm capable of entering into both the COR treatment chamber and the vacuum treatment chamber such that the transfer arm can transfer directly the object to be processed to the COR treatment chamber and the vacuum treatment chamber, the processed object processing method comprising:

a first communication step of opening the first gate valve so as to communicate the COR and vacuum treatment chambers with each other once a pressure inside the COR treatment chamber has become more than a pressure inside the vacuum treatment chamber while evacuating the vacuum treatment chamber; and a second communication step of opening the second gate valve so as to communicate the one load lock chamber and the vacuum treatment chamber with each other once a pressure inside the one load lock chamber has become more than the pressure inside the vacuum treatment chamber while evacuating the vacuum treatment chamber, wherein a gas is deliberately made to flow in the vacuum treatment chamber from the COR treatment chamber during said first communication step, and wherein following process condition is satisfied, a first treatment duration in the COR treatment chamber is equal to or greater than a summation of a second treatment duration in the vacuum treatment chamber and a first switching duration and a second switching duration and a duration of gas charging/exhausting for the one load lock chamber, where the first treatment duration is a duration of treatment of the processed object in the COR treatment chamber, the second treatment duration is a duration of treatment of the processed object in the vacuum treatment chamber, the first switching duration is a first time period taken to replace the processed object between the one load lock chamber and the vacuum treatment chamber, and the second switching duration is a second time period taken to switch the processed object between the one load lock chamber and an atmospheric transferring chamber connected to the one load lock chamber.

5. A processed object processing method as claimed in claim 4, wherein the vacuum treatment chamber is a heat treatment chamber in which heat treatment is carried out on objects to be processed that have been subjected to the COR treatment.

6. A processed object processing method as claimed in claim 4, wherein the COR treatment chamber and the heat treatment chamber are always in a vacuum state.

7. A processed object processing method a claimed in claim 4, further comprising a COR treatment chamber transfer step of transferring directly an object to be processed into the COR treatment chamber by the transfer arm while the vacuum treatment chamber houses another object to be processed therein.

8. A processed object processing method as claimed in claim 4, further comprising a vacuum treatment chamber transfer step of transferring directly an object to be processed out of the COR treatment chamber into the vacuum treatment chamber by the transfer arm while the one load lock chamber houses another object to be processed therein.

9. A processed object processing method as claimed in claim 1, wherein gas is deliberately made to flow in the second treatment chamber from the one load lock chamber during said second communication step.

10. A processed object processing method as claimed in claim 4, wherein gas is deliberately made to flow in the vacuum treatment chamber from the one load lock chamber during said second communication step.

11. A processed object processing method as claimed in claim 1, wherein in a case of performing said first communication step and said second communication step at the same time, a flow rate of gas into the second treatment chamber from the first treatment chamber is set equal to a flow rate of gas into the second treatment chamber from the one load lock chamber.

12. A processed object processing method as claimed in claim 4, wherein in a case of performing said first communication step and said second communication step at the same time, a flow rate of gas into the vacuum treatment chamber from the COR treatment chamber is set equal to a flow rate of gas into the vacuum treatment chamber from the one load lock chamber.

* * * * *